(12) United States Patent
Rho et al.

(10) Patent No.: US 11,277,549 B2
(45) Date of Patent: Mar. 15, 2022

(54) CAMERA MODULE, ELECTRONIC DEVICE EMPLOYING CAMERA MODULE, AND METHOD FOR CONTROLLING SAME

(71) Applicant: SAMSUNG ELECTRONICS CO., LTD., Suwon-si (KR)

(72) Inventors: Hyung Jin Rho, Yongin-si (KR); Young Bok Yu, Anyang-si (KR); Min Suk Hong, Seongnam-si (KR); Jeong Min Park, Hwaseong-si (KR); Ki Huk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/329,854

(22) PCT Filed: Jun. 22, 2017

(86) PCT No.: PCT/KR2017/006585
§ 371 (c)(1),
(2) Date: Mar. 1, 2019

(87) PCT Pub. No.: WO2018/043892
PCT Pub. Date: Mar. 8, 2018

(65) Prior Publication Data
US 2019/0246018 A1 Aug. 8, 2019

(30) Foreign Application Priority Data

Sep. 2, 2016 (KR) .................. 10-2016-0113466

(51) Int. Cl.
*H04N 5/225* (2006.01)
*G03B 9/02* (2021.01)
(Continued)

(52) U.S. Cl.
CPC ............. *H04N 5/2254* (2013.01); *G03B 9/02* (2013.01); *G03B 9/08* (2013.01); *G03B 11/04* (2013.01);
(Continued)

(58) Field of Classification Search
None
See application file for complete search history.

(56) References Cited

U.S. PATENT DOCUMENTS 8,947,627 B2  2/2015  Rappoport et al.
9,143,668 B2  9/2015  Mathew et al.
(Continued)

FOREIGN PATENT DOCUMENTS

KR  10-2010-0062533  6/2010
KR  10-2012-0046040  5/2012
(Continued)

OTHER PUBLICATIONS

International Search Report for PCT/KR2017/006585 with English-language translation, dated Sep. 29, 2017, 7 pages.
(Continued)

*Primary Examiner* — Quan Pham
(74) *Attorney, Agent, or Firm* — Nixon & Vanderhye, P.C.

(57) ABSTRACT

Disclosed are a camera module, an electronic device having the camera module, and a method for controlling the electronic device. The camera module includes an image sensor shooting an image, a body tube disposed above the image sensor, including a lens group and a housing including an opening formed at an upper end of the lens group and transmitting a light exiting through the opening and the lens group to the image sensor, a cover window positioned at an upper end of the opening of the body tube and including a transparent material, a transparent substrate positioned at a
(Continued)

lower end of the cover window, and an opaque conductive material disposed in a space defined by coupling the cover window to the transparent substrate. An electrode device is formed on the transparent substrate to generate an electric field or a magnetic field when receiving a power, and when the electric field or the magnetic field is generated, the conductive material reacts with the electric field or the magnetic field in the space and moves toward a center of the transparent substrate to cover the opening of the body tube.

15 Claims, 31 Drawing Sheets

(51) Int. Cl.
    *H04N 5/232*     (2006.01)
    *H05K 1/18*     (2006.01)
    *G03B 11/04*     (2021.01)
    *G03B 17/08*     (2021.01)
    *G03B 9/08*     (2021.01)

(52) U.S. Cl.
    CPC ............ *G03B 17/08* (2013.01); *H04N 5/225* (2013.01); *H04N 5/2252* (2013.01); *H04N 5/2257* (2013.01); *H04N 5/232411* (2018.08); *H05K 1/18* (2013.01)

(56) References Cited

U.S. PATENT DOCUMENTS

| | | | |
|---|---|---|---|
| 9,307,158 B2 | 4/2016 | Gleason et al. | |
| 9,543,364 B2 | 1/2017 | Rappoport et al. | |
| 9,825,103 B2 | 11/2017 | Rappoport et al. | |
| 10,009,525 B2 | 6/2018 | Mathew et al. | |
| 10,121,831 B2 | 11/2018 | Rappoport et al. | |
| 2008/0124072 A1 | 5/2008 | Yuan | |
| 2012/0105400 A1* | 5/2012 | Mathew | H04N 5/2257 345/207 |
| 2013/0016515 A1* | 1/2013 | Chang | G03B 9/02 362/293 |
| 2013/0094126 A1 | 4/2013 | Rappoport et al. | |
| 2014/0191107 A1* | 7/2014 | Lee | G01J 1/0437 250/201.1 |
| 2014/0192256 A1 | 7/2014 | Gleason et al. | |
| 2014/0192257 A1 | 7/2014 | Gleason et al. | |
| 2015/0130996 A1* | 5/2015 | Chang | H04N 5/2354 348/370 |
| 2015/0144934 A1 | 5/2015 | Rappoport et al. | |
| 2015/0277210 A1* | 10/2015 | Lee | G03B 9/02 396/506 |
| 2016/0011633 A1* | 1/2016 | Watanabe | G06F 1/1637 345/184 |
| 2016/0142606 A1 | 5/2016 | Gleason et al. | |
| 2016/0212311 A1 | 7/2016 | Mathew et al. | |
| 2017/0117336 A1 | 4/2017 | Rappoport et al. | |
| 2017/0160766 A1* | 6/2017 | Gupta | G02F 1/1333 |
| 2018/0069060 A1 | 3/2018 | Rappoport et al. | |

FOREIGN PATENT DOCUMENTS

| | | |
|---|---|---|
| KR | 10-2015-0005704 | 1/2015 |
| KR | 10-2015-0089681 | 8/2015 |

OTHER PUBLICATIONS

Written Opinion of the ISA for PCT/KR2017/006585, dated Sep. 29, 2017, 5 pages.

* cited by examiner

POWER OFF

310

POWER ON

CAMERA MODULE, ELECTRONIC DEVICE EMPLOYING CAMERA MODULE, AND METHOD FOR CONTROLLING SAME This application is the U.S. national phase of International Application No. PCT/KR2017/006585 filed 22 Jun. 2017, which designated the U.S. and claims priority to KR Patent Application No. 10-2016-0113466 filed 2 Sep. 2016, the entire contents of each of which are hereby incorporated by reference.

TECHNICAL FIELD

Various embodiments disclosed in the disclosure relate to a technology for controlling a camera lens.

DESCRIPTION OF RELATED ART

An electronic device includes a camera module mounted on its front or rear surface. The camera module mounted on a front surface of a mobile is located, for example, in a top bezel of a display.

However, the camera module located in the bezel acts as a constraint on the implementation of the full display.

SUMMARY

Various embodiments disclosed in the disclosure provide a camera module capable of improving a sense of unfamiliarity of a display screen due to the camera module, an electronic device having the camera module, and a method for controlling the electronic device.

A camera module includes an image sensor that shoots an image, a body tube disposed above the image sensor, the body tube including a lens group and a housing including an opening formed at an upper end of the lens group and transmitting a light exiting through the opening and the lens group to the image sensor, a cover window positioned at an upper end of the opening of the body tube and including a transparent material, a transparent substrate positioned at a lower end of the cover window, and an opaque conductive material disposed in a space defined by coupling the cover window to the transparent substrate. An electrode device is formed on the transparent substrate to generate an electric field or a magnetic field when receiving a power, and when the electric field or the magnetic field is generated, the opaque conductive material reacts with the electric field or the magnetic field in the space and moves toward a center of the transparent substrate to cover the opening of the body tube.

An electronic device includes a display module including a cover glass and a display positioned at a lower end of the cover glass; a camera module including a body tube including an image sensor shooting an image and a lens group and transmitting a light received thereto through an opening to the image sensor via the lens group, a hidden camera module that is disposed at a same height as at least a portion of the display under the cover glass, includes at least an area positioned in the opening of the body tube, and covers at least a portion of the opening of the body tube through the at least the area, and a processor applying or breaking the power to the hidden camera module when the display module is in an active state and the camera module is not in a shooting mode so as to cover the at least the portion of the body tube opening. The hidden camera module includes a transparent housing in which the at least the area is positioned in the opening of the body tube, an electrode device generating an electric field or a magnetic field when the power is applied, and an opaque conductive material reacting with the electric field or the magnetic field and moving in the space of the transparent housing to cover the opening of the body tube.

A method for controlling a hidden camera module that includes an opaque conductive material and a transparent non-conductive material, which are in a housing whose at least a portion is transparent, disposed between a camera module and a display module by using at least one processor includes identifying whether the camera module is in a shooting mode when the display module is in an active state, and allowing the conductive material to cover at least a portion of a body tube opening of the camera module by the conductive material using an electric field or a magnetic field when the camera module is not in the shooting mode.

The embodiments disclosed in the disclosure may improve the sense of unfamiliarity of the display screen, which is caused by the camera module.

DETAILED DESCRIPTION OF EXAMPLE EMBODIMENTS

Figure 1A:
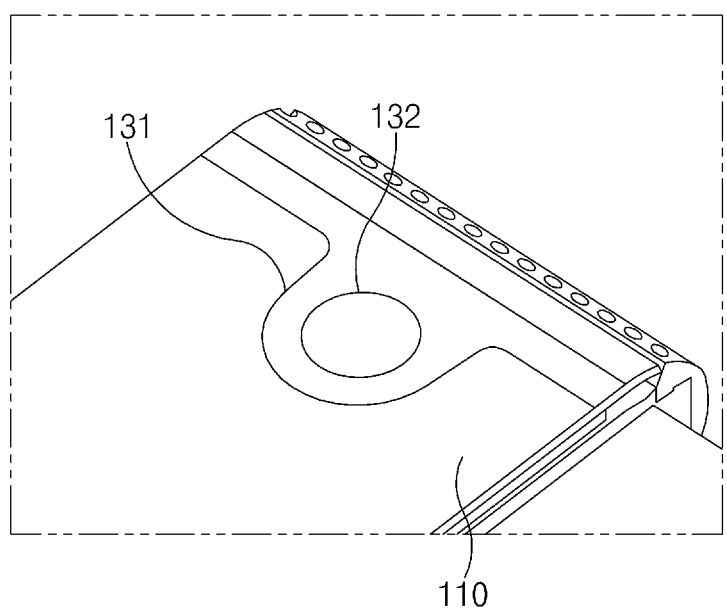
FIGS. 1A and 1B are views illustrating an electronic device to which a camera module is applied.

Hereinafter, certain embodiments of the disclosure may be described with reference to accompanying drawings. Accordingly, those of ordinary skill in the art will recognize that modifications, equivalents, and/or alternatives on the various embodiments described herein may be made without departing from the scope and spirit of the disclosure. Throughout the drawings, it should be noted that like reference numbers are used to depict the same or similar elements, features, and structures. The terms of a singular form may include plural forms unless otherwise specified. In the disclosure, the expressions "A or B", "at least one of A and/or B", "A, B, or C", or at least one of "A, B and/or C" may include all possible combinations of one or more of the associated listed items. The terms such as "first", "second", and the like used herein may refer to various elements regardless of the order and/or priority of the elements and may be used to distinguish an element from another element, not to limit the elements. It will be understood that when an element (e.g., a first element) is referred to as being "(operatively or communicatively) coupled with/to" or "connected to" another element (e.g., a second element), the element may be directly coupled with/to or connected to the another element or an intervening element (e.g., a third element) may be present there between.

In the disclosure, according to the situation, the expression "adapted to or configured to" used herein may be interchangeably used with, for example, the expression "suitable for", "having the capacity to", "changed to", "made to", "capable of" "designed to", or "adapted to". Under a certain situation, the expression "a device configured to" may mean that the device is "capable of" operating together with another device or other components. For example, a "processor configured to (or adapted to) perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

An electronic device according to various embodiments of the disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit). In some various embodiments of the disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame In other various embodiments of the disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like). According to various embodiments of the disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the disclosure may be a flexible device. An electronic device according to an embodiment of the disclosure is not limited to the above-mentioned devices. The term "user" used herein may refer to a person who uses an electronic device or may refer to a device (e.g., an artificial intelligence electronic device) that uses an electronic device.

Figure 1B:
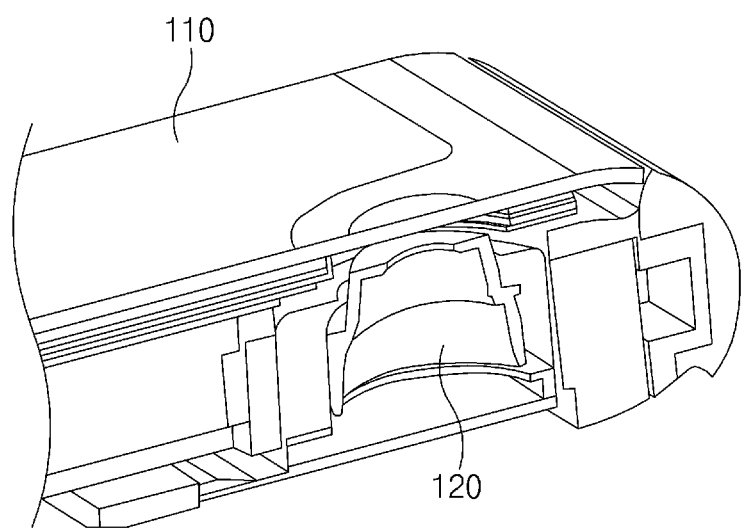

FIG. 1A is a view illustrating a portion of an outer surface of an electronic device in which a hidden camera module according to an embodiment of the disclosure is applied to a front surface of a display, and FIG. 1B is a cross-sectional view illustrating the electronic device in which the hidden camera module according to an embodiment of the disclosure is applied to the front surface of the display.

According to an embodiment, a body tube 120 of the camera module may be disposed in an area, for example, at a bottom or a side surface of the display, other than a bezel of the electronic device. Referring to FIGS. 1A and 1B, when the camera module is disposed at the bottom or side surface of the display 110, recess holes 131 and 132 formed by recessing portions of the display 110 may be provided. For example, a U-cut 131 or a circle hole 132 is formed at an upper end of the body tube 420 of the display 110. In this case, when viewed from the top of the display 110, the body tube 120 of the camera module and other members of the display 110 disposed around the body tube 120 may be exposed to an outside through the recess holes 131 and 132. A user may feel a sense of unfamiliarity due to a formation portion of the camera module.

Figure 2A:
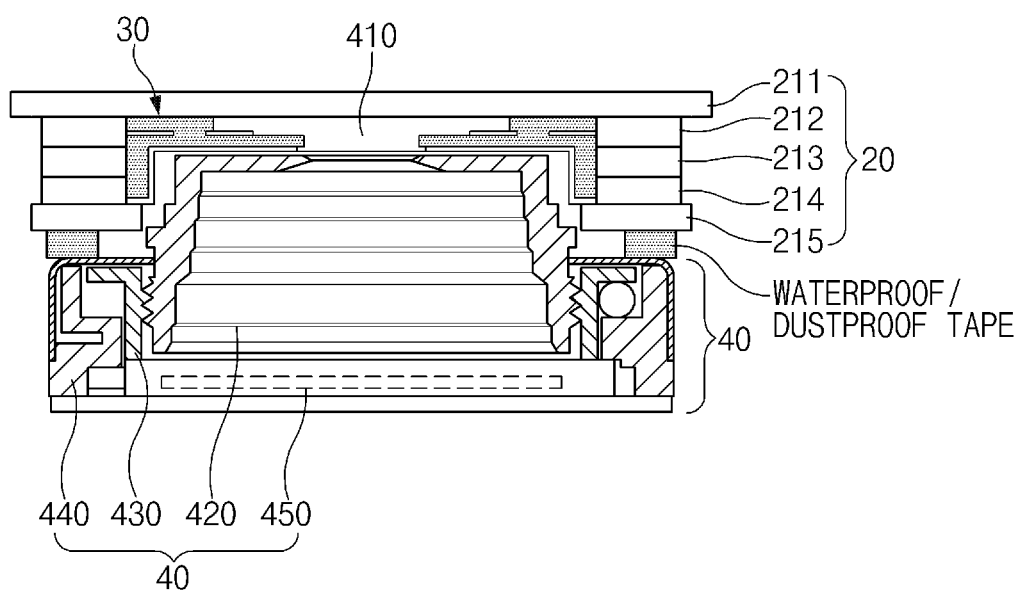
FIGS. 2A and 2B are cross-sectional views illustrating an electronic device to which a hidden camera module is applied according to an embodiment of the disclosure.
Figure 2B:
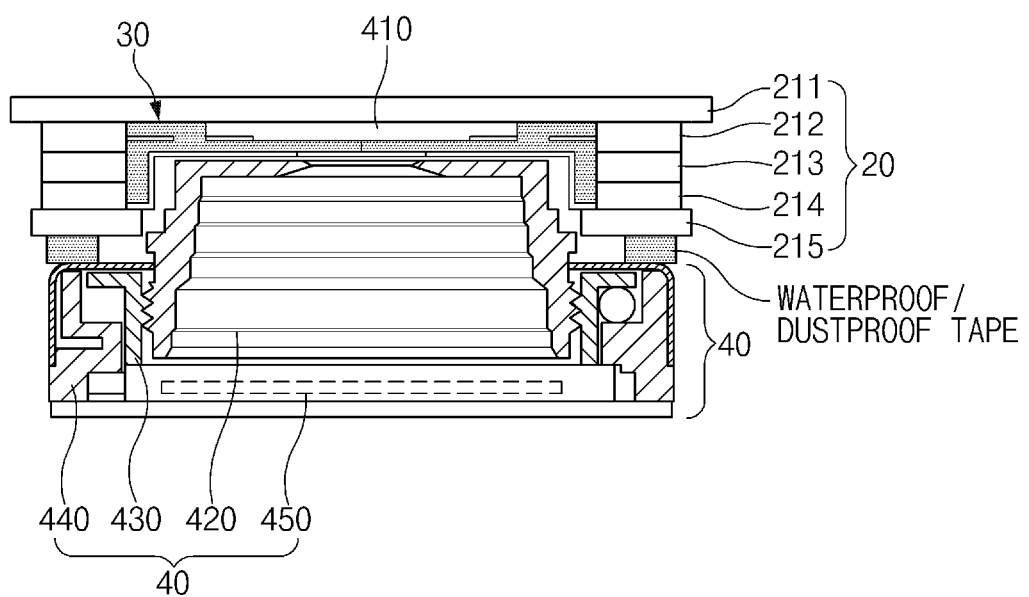
Figure 2C:
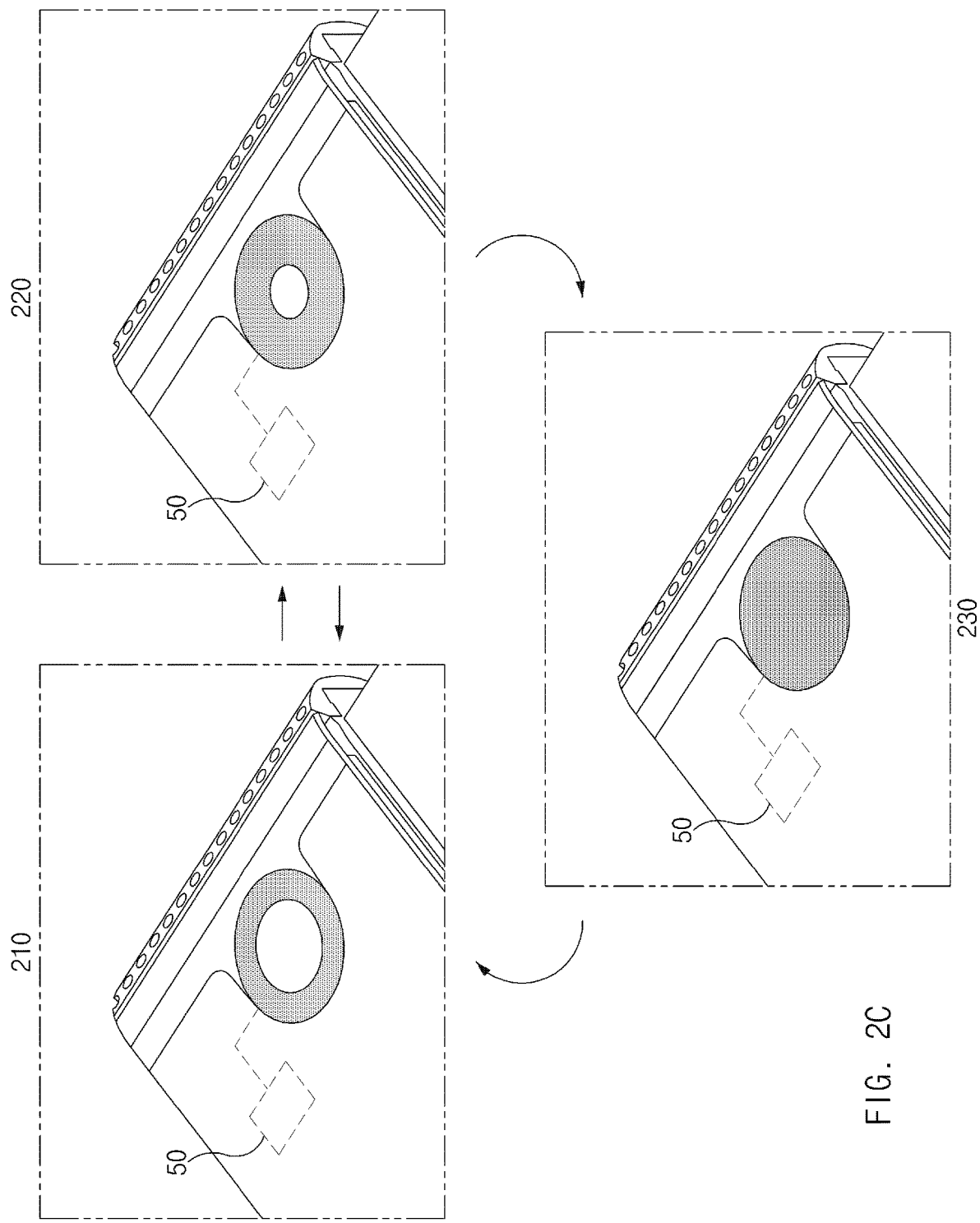
FIG. 2C is a view illustrating an operation state of a hidden camera module according to an embodiment of the disclosure.

FIGS. 2A and 2B are cross-sectional views illustrating an electronic device to which a hidden camera module is applied according to an embodiment of the disclosure, and FIG. 2C is a view illustrating a plurality of states of the hidden camera module according to an embodiment of the disclosure.

As shown in FIG. 2A, the electronic device according to the embodiment of the disclosure may include a display module 20, a camera device 40, a hidden camera module 30, and a controller 50.

According to an embodiment of the disclosure, the display module 20 may include a cover glass 211, a touch screen panel 212, a display panel 213, a pressure sensor 214, and an FPCB 215. Hereinafter, each component of the display module 20 will be described.

According to an embodiment of the disclosure, the cover glass 211 may be disposed at an exterior of the display of the electronic device. The cover glass 211 may be, for example, a transparent glass. The cover glass 211 may be provided separately from the display module 20. For example, the cover glass 211 may be included in a housing of the electronic device.

According to an embodiment of the disclosure, the touch screen panel 212 may disposed under the cover glass 211 and may sense a user's touch. The touch screen panel 212 may transmit the sensed touch to a main processor (e.g., processor 920 of FIG. 9) of the electronic device.

Figure 9:
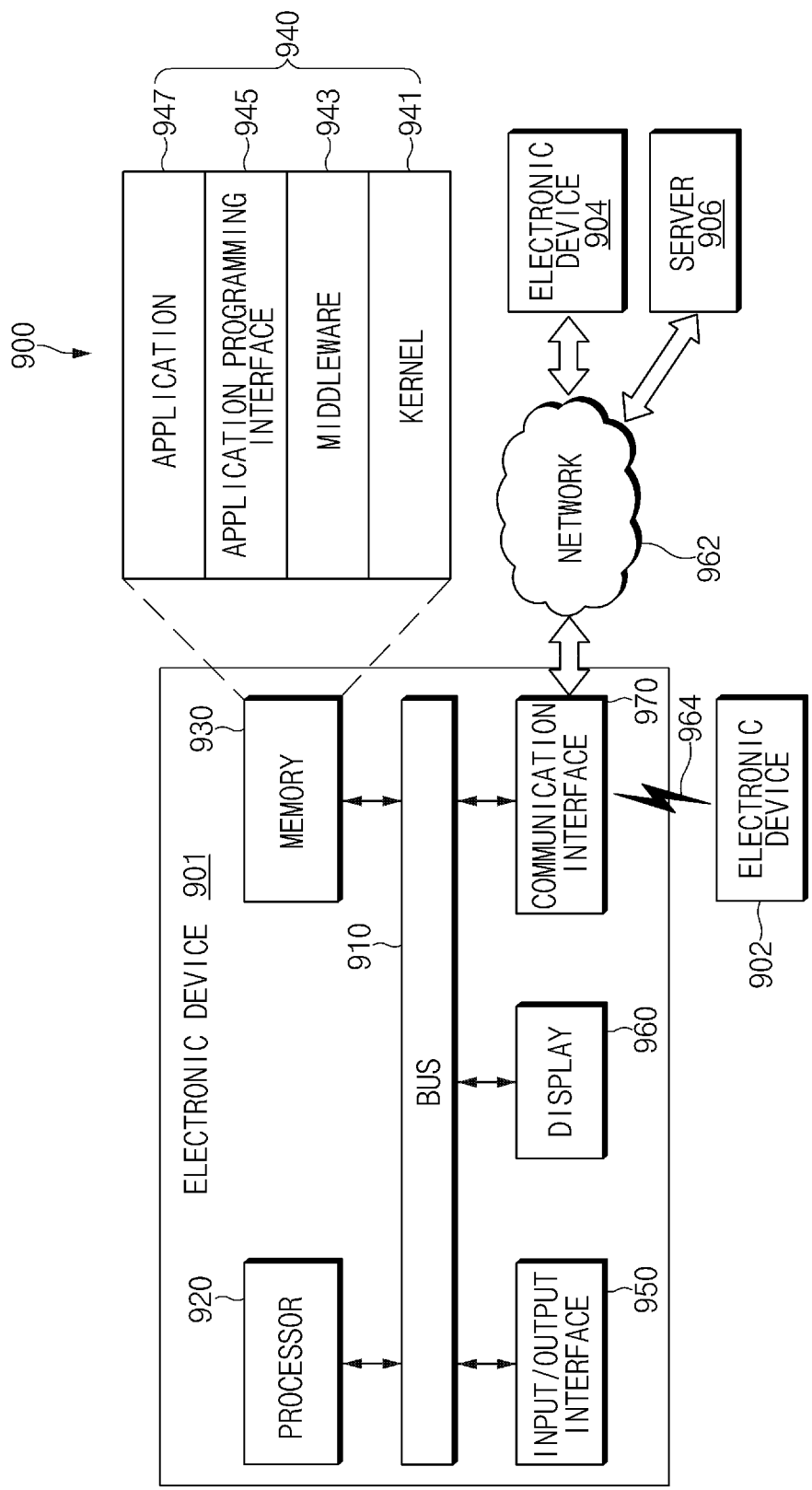
FIG. 9 is a view illustrating an electronic device in a network environment according to various embodiments.

According to an embodiment of the disclosure, the display panel 213 may display an image in response to instructions by the main processor (e.g., processor 920 of FIG. 9).

According to an embodiment of the disclosure, the pressure sensor 214 may sense a pressure applied to an upper portion of the cover glass 211 and may transmit the sensed pressure to the main processor of the electronic device. The pressure sensor 214 may be omitted.

According to an embodiment of the disclosure, the FPCB 215 may be connected with a driver IC that controls the display panel 213 and an interface node between the pressure sensor 214 and the touch screen panel 212. In addition, the FPCB 215 may further include a power interface to apply an electric or magnetic field to the hidden camera module 30.

According to an embodiment of the disclosure, the camera device 40 may be disposed between a stack structure of the display module 20. According to an embodiment of the disclosure, the camera device 40 may include a body tube 420, a lens driver 430, a housing 440, an image sensor 450. At least one of the body tube 420, the lens driver 430, the housing 440, or the image sensor 450 may be omitted. Hereinafter, each component of the camera device 40 will be described.

According to an embodiment of the disclosure, the body tube 420 may include an opening 410 at an upper end thereof, to which a light from the top of the cover glass 211 is incident. The body tube 420 may include a lens group and a housing member including the opening 410 defined above the lens group. The body tube 420 may transmit the light passing through the opening 410 and the lens group to the image sensor 450. The other opening may be provided at a lower portion of the body tube 420 to transmit the light passing through the lens group in the body tube 420 to the image sensor 450.

According to an embodiment of the disclosure, the housing 440 may protect at least a portion of the body tube 420, the lens driver 430, and the image sensor 450.

According to an embodiment of the disclosure, the lens driver 430 may adjust an interval between the body tube 420 and the image sensor 450 for automatic focus adjustment. The lens driver 430 may be omitted.

According to an embodiment of the disclosure, the hidden camera module 30 may include an opaque conductive material in the housing whose at least one portion is transparent. The hidden camera module 30 may cover or open at least a portion of the opening 410 using the opaque conductive material that moves in response to the electric field or the magnetic field. In addition, the hidden camera module 30 may adjust a degree of the opening (or covering) of the opening 410.

According to an embodiment of the disclosure, the hidden camera module 30 may cover at least a portion of a partition wall space between the camera device 40 and the display module 20 below the cover glass 211 of the display module 20. For example, the hidden camera module 30 may prevent the touch screen panel 212 and the pressure sensor 214 from being exposed to the outside through the recess holes 131 and 132. In various embodiments of the disclosure, since at least the portion of the opening of the body tube is covered by the hidden camera module 30, members of the display module 20 or the camera device 40 may be prevented from being exposed to the outside through the opening of the body tube.

Referring to FIG. 2C, as shown in a state 210, the hidden camera module 30 may include the transparent housing (or a moving space for a conductive material) that includes the conductive material therein. The hidden camera module 30 may control the conductive material to be located outside the transparent housing, and thus the opening of the body tube may be opened.

As shown in states 210 and 220, the hidden camera module 30 may adjust the opening degree of the opening 410 using the opaque conductive material. For example, the opening degree of the opening 410 may be adjusted by controlling an intensity of the electric or magnetic field applied to the opaque conductive material.

As shown in a state 230, the hidden camera module 30 may cover at least the portion of the opening of the body tube 420 using the opaque conductive material that moves within the moving space. The hidden camera module 30 may open or cover the opening 410 in response to a control of the controller 50.

According to an embodiment of the disclosure, the hidden camera module 30 may be disposed on a lower surface of the cover glass 211 at the same height as at least one other component of the display module. However, most portion of the hidden camera module 30 may be disposed at an upper portion of the body tube 420 so that the hidden camera module 30 may faithfully perform a function of covering or hiding the opening 410. Detailed descriptions on the configuration of the hidden camera module 30 will be described later with reference to FIGS. 4A to 4D.

According to an embodiment of the disclosure, the controller 50 may apply or break the power to the hidden camera module 30 to allow the hidden camera module 30 to cover or open the opening 410. The controller 50 may control the intensity of the electric field or the magnetic field generated by the hidden camera module 30 to allow the hidden camera module 30 to cover or open the opening 410 or to adjust the degree of the covering of the opening 410.

According to an embodiment of the disclosure, the controller 50 may control the hidden camera module 30 based on the states of the image sensor 450 and the display (e.g., the display panel 213). For example, the controller 50 may cover the opening of the body tube 420 using the hidden camera module 30 when the display module 20 is in an inactive state and the image sensor 450 is not in a shooting mode. As another example, the controller 50 may control the hidden camera module 30 to hide the opening of the body tube 420 when the screen of the display panel 213 is turned off.

According to an embodiment of the disclosure, the controller 50 may control the intensity of the electric field or the magnetic field applied to the hidden camera module 30 in the shooting mode of the image sensor 450 to operate the hidden camera module 30 as an aperture. In this case, the controller 50 may identify a photographing luminance and control the intensity of the electric field or the magnetic field so as to obtain an exposure suitable for photographing.

According to an embodiment of the disclosure, the controller 50 may be a main processor of the electronic device and may be a driver IC (DDI; display driver IC) of the display module 20. In the latter case, the controller 50 may be connected to the hidden camera module 30 through the FPCB 215 of the display module 20. As an example, the controller 50 may apply the power of the FPCB 215 and may apply the electric field or the magnetic field to the hidden camera module 30. The controller 50 may adjust an opening amount of the hidden camera module 30 by adjusting a level of the power (for example, a voltage value or a current value) applied to the hidden camera module 30 from the FPCB 215.

The embodiments of the disclosure may perform a lens hiding function, a lens aperture function, or a lens cover function by applying the hidden camera module between the cover glass of the display module and the camera module. The embodiments of the disclosure may improve the sense of unfamiliarity of the display, which is caused when the lens body tube of the camera module disposed under the display is projected to be exposed to the outside.

Figure 3A:
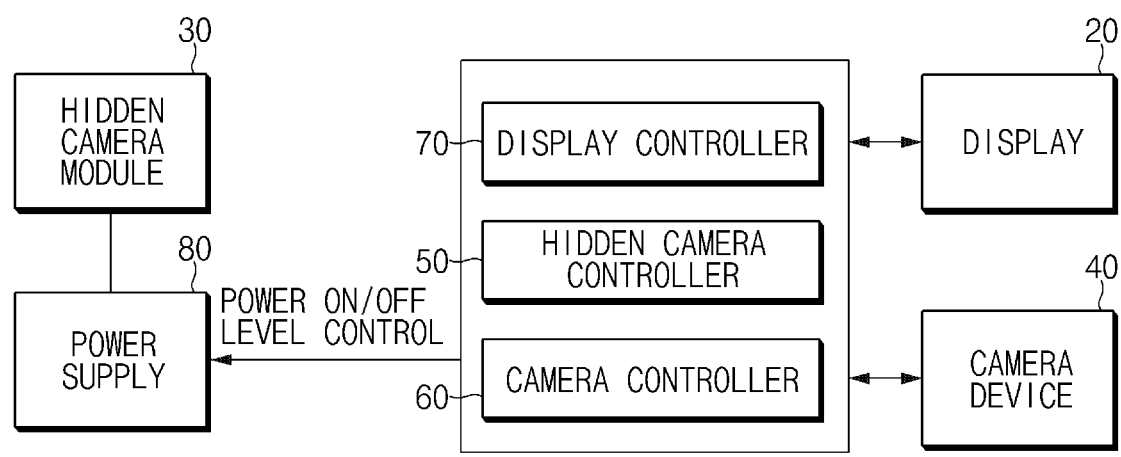
FIG. 3A is a view illustrating a control relation between a hidden camera module and a camera device according to an embodiment of the disclosure.

FIG. 3A is a view illustrating a control relation between a hidden camera module and a camera device according to an embodiment of the disclosure.

In FIG. 3A, each of a display controller 70, a camera controller 60, and a hidden camera controller 50 may be a hardware module or a software module implemented by at least one processor. For instance, functions performed by the display controller 70, the hidden camera controller 50, and the camera controller 60 may be executed by one processor or separate processors, respectively. As another example, the display controller 70, the camera controller 60, and the hidden camera controller 50 may be included in one processor or included in a plurality of processors.

According to an embodiment of the disclosure, the display controller 70 may control an image output of the display module 20. For example, the display controller 70 may output a preview image from the camera device 40 to the display module 20. The display controller 70 may control ON and OFF of a backlight of the display module 20.

According to an embodiment of the disclosure, the camera controller 60 may control shooting, focusing, and the like of the camera device 40 in the shooting mode. The camera controller 60 may turn off the image sensor 450 of the camera device 40 when the shooting mode is not selected.

According to an embodiment of the disclosure, the hidden camera controller 50 may transmit a querying signal to the display controller 70 and the camera controller 60 and may identify a response signal to the querying signal to determine whether the display is activated and the shooting mode is selected. The hidden camera controller 50 may hide the opening of the body tube of the camera device 40 by using the hidden camera module 30 when the display is activated and the shooting mode is not in selected. As an example, the hidden camera controller 50 may control a power supply 80 not to supply the power to the hidden camera module 30.

According to an embodiment of the disclosure, the hidden camera controller 50 may control the intensity of the electric field or the magnetic field applied to the hidden camera module 30 in the shooting mode of the image sensor of the camera device 40 to operate the hidden camera module 30 as the aperture. For example, the hidden camera controller 50 may control a level of the power applied to the hidden camera module 30 from the power supply 80 by controlling a control signal of the power supply 80 (e.g., controlling a level of the control signal).

According to an embodiment of the disclosure, the power supply 80 may apply the power having the level corresponding to the control by the hidden camera controller 50 to the hidden camera module 30. According to an embodiment of the disclosure, the power supply 80 may be included in the display module 20 or the camera device 40. The power supply 80 may be a component mounted on a printed circuit board different from that of the display module 20 and the camera device 40.

According to an embodiment of the disclosure, the hidden camera controller 50 may communicate with at least one of the display controller 70 and the camera controller 60 to identify an operation state of the display panel 213 and the image sensor 450. To this end, a communication module or a communication interface may be provided between the hidden camera controller 50, the display controller 70, and the camera controller 60.

Figure 3B:
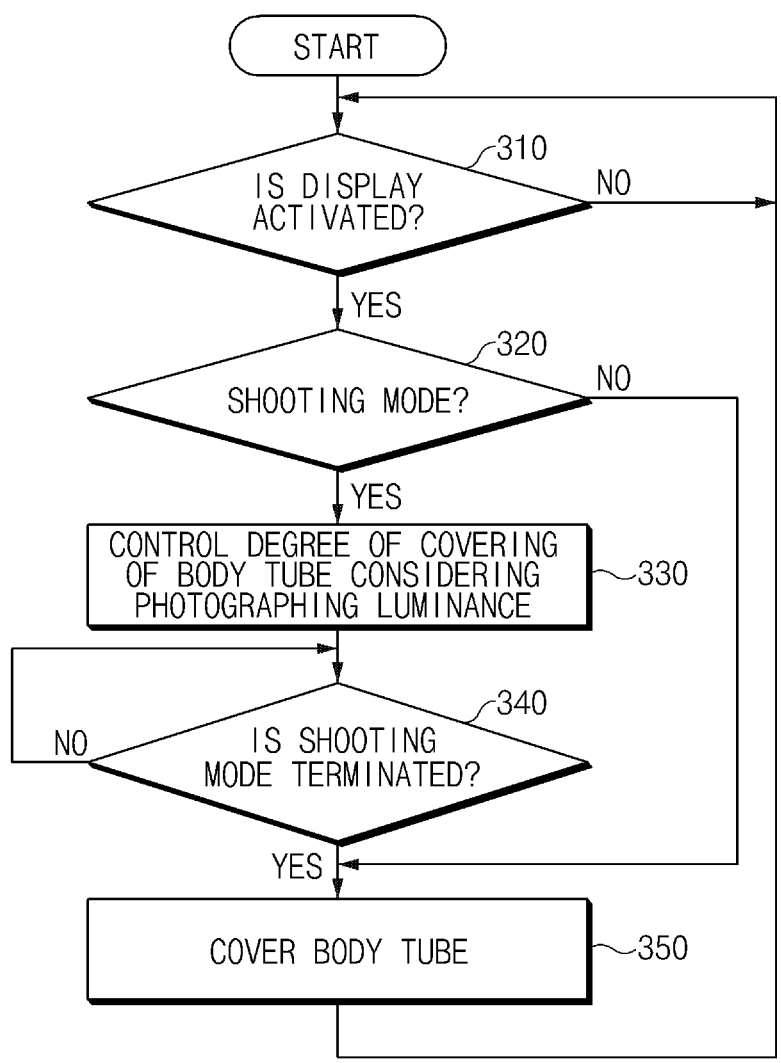
FIG. 3B is a flowchart illustrating a method for driving a hidden camera module according to an embodiment of the disclosure.

FIG. 3B is a flowchart illustrating a method for driving a hidden camera module according to an embodiment of the disclosure.

Referring to FIG. 3B, in operation 310, the controller 50 may identify whether the display module 20 is in the active state. The active state of the display module 20 may be at least one of a moving image play state, a photo presentation state, or a display execution state.

In operation 320, the controller 50 may identify whether the camera shooting mode is selected when the display module 20 is in the active state.

In operation 330, the controller 50 may operate the hidden camera module 30 as the aperture when the camera shooting mode is selected. The controller 50 may identify the photographing luminance and may control the power (level of voltage or current) applied to an electrode device 340 of the hidden camera module 30 so as to obtain the exposure suitable for photographing. Accordingly, the controller 50 may adjust the degree of the covering of the opening 410 by the hidden camera module 30. For example, as the level of the voltage or current applied to the electrode device 340 increases, the opening 410 may be more covered.

The degree of covering of the opening 410 corresponding to the photographing luminance, the intensity of the electric field or the magnetic field corresponding thereto, or the power (level of the voltage or current) applied to the electrode device 340 may be determined experimentally.

In operation 340, the controller 50 may identify whether the shooting mode is terminated while operating the hidden camera module 30 as the aperture in the camera shooting mode.

In operation 350, when it is determined in operations 310, 320, and 340 that the camera shooting mode is not selected in the active state of the display module 20, the controller 50 may apply the electric field or the magnetic field to the hidden camera module 30 to cover the area of the opening 410, which is exposed to the outside. As an example, the controller 50 may completely cover the opening 410.

Various embodiments of the disclosure may perform the lens hiding function or the aperture function of the body tube by applying the hidden camera module between the cover glass of the display module and the camera module.

Various embodiments of the disclosure may improve the sense of unfamiliarity of the display, which is caused when the lens body tube disposed under the display is projected to be seen.

Figure 4A:
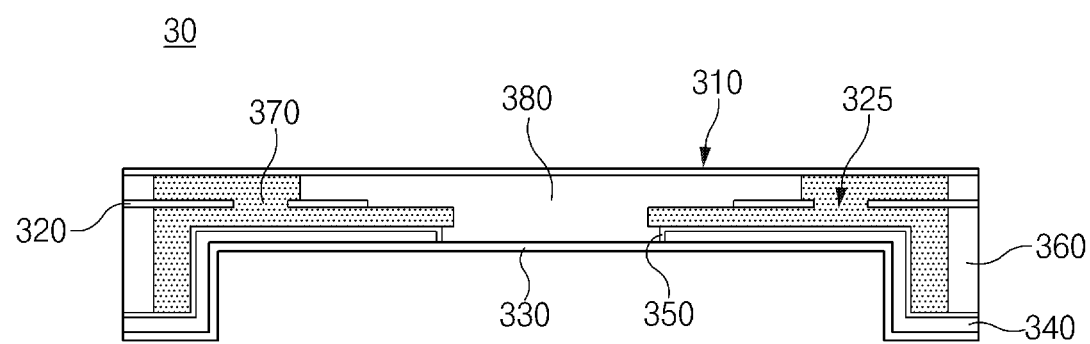
FIG. 4A is a cross-sectional view illustrating a hidden camera module according to an embodiment of the disclosure.
Figure 4B:
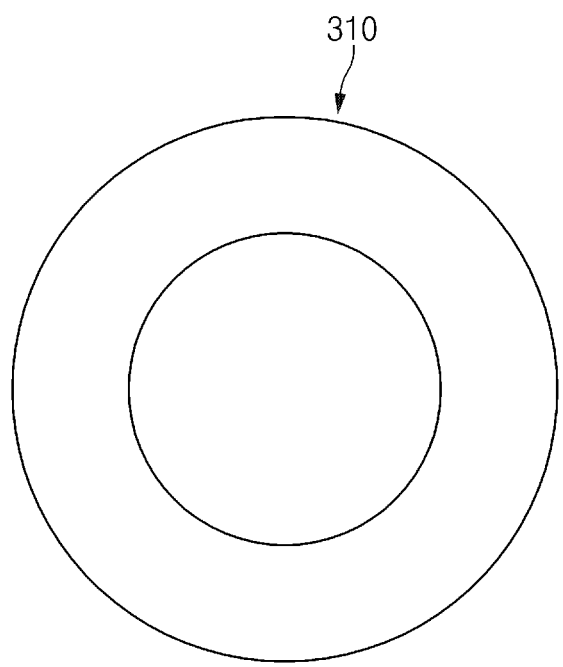
FIG. 4B is a view illustrating a bottom of a transparent substrate viewed from bottom according to an embodiment of the disclosure.
Figure 4C:
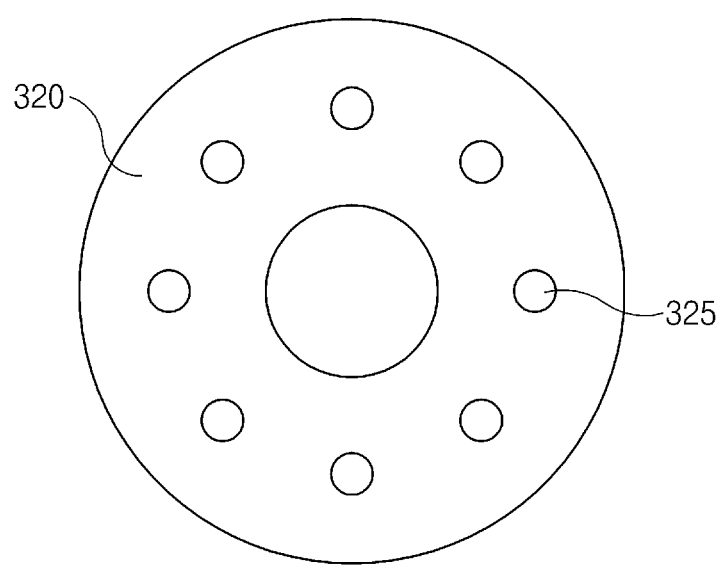
FIG. 4C is a view illustrating a buffer member viewed from top according to an embodiment of the disclosure.
Figure 4D:
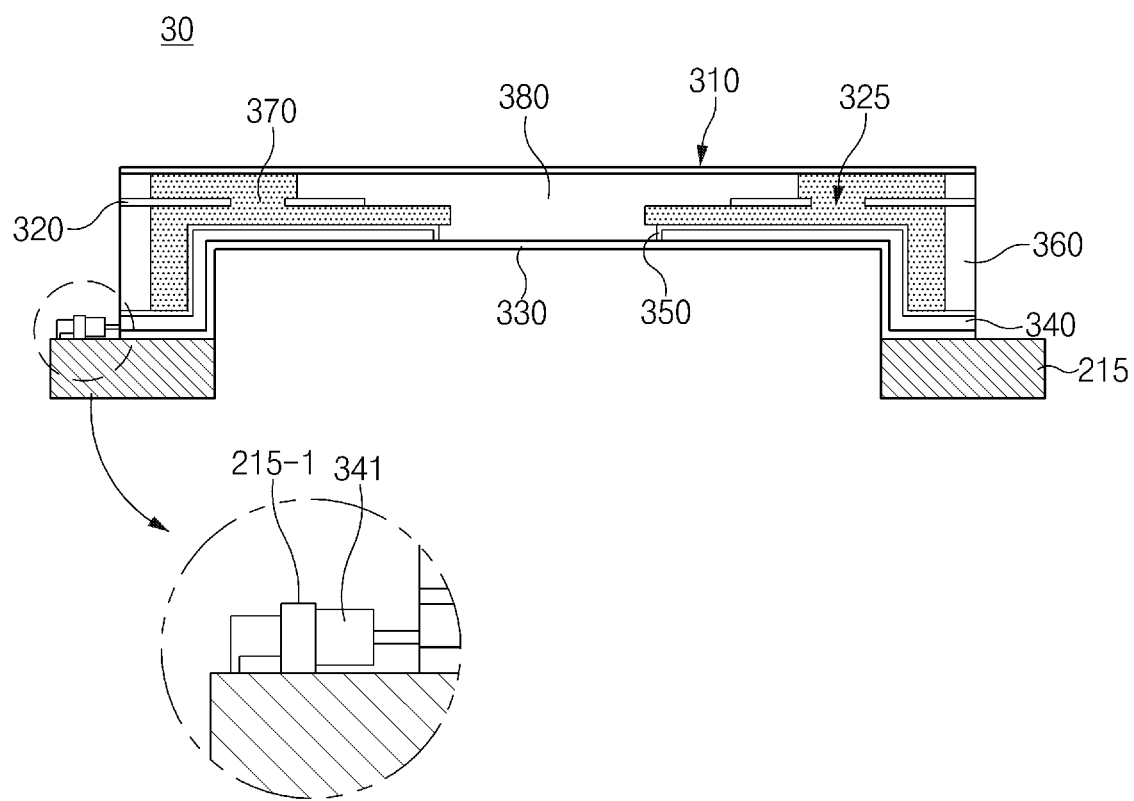
FIG. 4D is a view illustrating a power connection structure of a hidden camera module according to an embodiment of the disclosure.

FIG. 4A is a cross-sectional view illustrating a hidden camera module according to an embodiment of the disclosure, FIG. 4B is a view illustrating a transparent substrate viewed from bottom according to an embodiment of the disclosure, FIG. 4C is a view illustrating a buffer member viewed from top according to an embodiment of the disclosure, and FIG. 4D is a view illustrating a power supply structure according to an embodiment of the disclosure.

As shown in FIG. 4A, the hidden camera module 30 according to an embodiment of the disclosure may include a cover window 310, a transparent substrate 330, the electrode device 340, a spacer 360, a conductive material 370, a non-conductive material 380, and a buffer member 320.

According to an embodiment of the disclosure, the cover window 310 may be coupled to the transparent substrate 330 and the spacer 360 to form the moving space (or, the housing of which at least the portion is transparent) in which the conductive material 370 and the non-conductive material 380 move. The transparent area in the housing of which at least the portion is transparent may be an area positioned at the upper end of the opening 410 of the body tube 420.

According to an embodiment of the disclosure, the cover window 310 may be disposed on the lower portion of the cover glass 211 of the display module and at the upper end of the opening 410. For instance, the cover window 310 may be disposed substantially parallel to a surface through which the opening 410 is formed in the housing member of the body tube 420.

According to an embodiment of the disclosure, the spacer 360 may be coupled to surfaces of the cover window 310 and the transparent substrate 330, which face each other, at edges of the facing surfaces of the cover window 310 and the transparent substrate 330. In an embodiment, the spacer 360 may be formed to prevent the cover window 310 and the transparent substrate 330 from being deformed. As an example, since the spacer 360 may have a thickness that is at least twice a thickness of the cover window 310 and the transparent substrate 330 and may support the facing surfaces of the cover window 310 and the transparent substrate 330, the moving space may be prevented from being deformed. Accordingly, in the embodiment of the disclosure, the hidden camera module may be prevented from being damaged even when the electronic device is pressed by an external pressure.

According to an embodiment of the disclosure, surfaces of the cover window 310 and the transparent substrate 330, which make contact with the spacer 360, may be sealed by sealing member. Therefore, various embodiments of the disclosure may prevent the conductive material 370 and the non-conductive material 380 from leaking through cracks of the moving space.

According to an embodiment of the disclosure, the cover window 310 may be formed of a transparent glass or plastic material. However, since the conductive material or the non-conductive material is provided under the cover window 310, when the conductive or non-conductive material leaks out, other components of the electronic device may be damaged. To prevent this, the cover window 310 may be formed of a rigid material that is not easily deformed.

According to an embodiment of the disclosure, the cover window 310 may be formed not to be easily coupled with the conductive material 370. For example, the cover window 310 may be coated with a non-hydrophilic material to remove affinity to the conductive material 370. Thus, a contact area between the conductive material 370 and the cover window 310 may decrease.

According to an embodiment of the disclosure, the transparent substrate 330 may be disposed to be connected to the body tube 420, and the electrode device 340 may be formed on or under the transparent substrate 330. The transparent substrate 330 may include a transparent glass or plastic material.

Figure 5A:
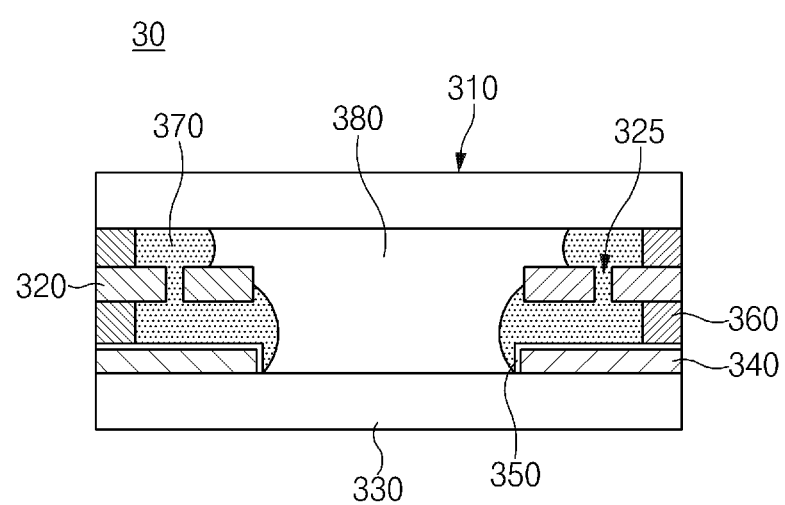
FIGS. 5A and 5B are views illustrating an operation of a hidden camera module according to an embodiment of the disclosure.
Figure 5B:
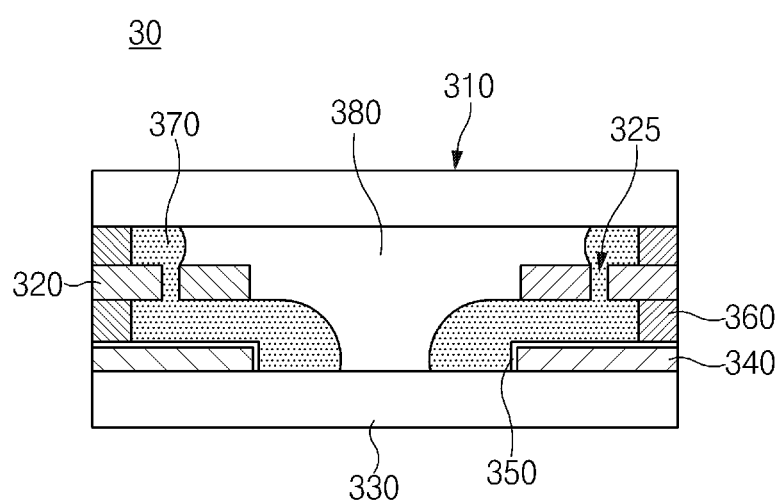

According to an embodiment of the disclosure, the transparent substrate 330 may be formed in a shape that may be disposed on the partition wall between the body tube 420 and the display module 20. As an example, as described in FIGS. 2A and 2B, an open space of the display module 20 may have a cylindrical shape whose one end is opened and the other end is closed. In this case, according to an embodiment, the transparent substrate 330 may have a pulse shape when viewed in cross section as shown in FIG. 4A and may have a circular shape similar to the cover window 310 when viewed in a top (or bottom) plan view as shown in FIG. 4B. According to an embodiment of the disclosure, as shown in FIGS. 5A and 5B, the transparent substrate 330 may have the circular shape when viewed in the top (or bottom) plan view and may have a bar shape when viewed in cross-section.

According to an embodiment of the disclosure, the electrode device 340 may be a power pattern formed on or under the transparent substrate 330. When the power is supplied to the electrode device 340 from the outside, the electric field or the magnetic field may be generated on or under the transparent substrate 330. In this case, the level of the power (level of the voltage or current) supplied to the electrode device 340 may be adjusted, and thus the intensity of the generated electric field or the magnetic field may be changed.

According to an embodiment of the disclosure, the electrode device 340 may receive the power from the FPCB 215 of the display module. For example, as shown in FIG. 4D, the electrode device 340 may receive the power from the FPCB 215 through a first connector 341 and a second connector 215-1. The first connector 341 may be, for example, a connector connected to the electrode device 340 by a plurality of wires. The wires may include two wires respectively corresponding to a positive (+) power and a ground. The first connector 341 may be inserted into the second connector 215-1, and the first and second connectors 341 and 215-1 may be electrically connected to each other. The second connector 215-1 may be a connector mounted on or connected to the FPCB 215 of the display module. According to another embodiment of the disclosure, the electrode device 340 may receive the power from the printed circuit board on which the image sensor 450 is mounted rather than the FPCB 215 of the display module.

According to an embodiment of the disclosure, the electrode device 340 may be formed not to be damaged by the conductive material 370. For example, the electrode device 340 may be coated with a non-conductive material (e.g., dielectric substance).

According to an embodiment of the disclosure, the electrode device 340 may be formed at a position where the opening 410 is not covered by the electrode device 340 in the transparent substrate 330. For example, the electrode device 340 may be disposed along a circumference of a surface making contact with the opening 410 of the transparent substrate 330 and may have a donut shape. In this case, an inner diameter of the donut shape may be equal to or larger than a diameter of the opening 410.

According to an embodiment of the disclosure, the conductive material 370 may be an achromatic or chromatic opaque material and inserted into the transparent housing (or, moving space). In the present embodiment, the transparent housing may be a housing of the hidden camera module 30, which is formed by coupling the cover window 310, the transparent substrate 330, the spacer 360, and the buffer member 320. The transparent housing may be formed in a shape that may be disposed on the partition wall between the body tube 420 and the display module 20. As an example, the transparent housing may have a cap shape. The transparent housing may be totally transparent and may be formed such that at least a portion including an area positioned at the upper end of the opening 410 is transparent.

According to an embodiment of the disclosure, a color of the conductive material 370 may be the same as or similar to that of a portion on which the hidden camera module 30 is mounted. For example, the color of the conductive material 370 included in the hidden camera module 30 mounted on a bezel of a front display may be the same as or similar to that of the bezel of the display.

According to an embodiment of the disclosure, the conductive material 370 may be formed to have the color that varies depending on the electric field or the magnetic field. For example, the color of the conductive material 370 may be changed to the same as or similar color to that of an image displayed in proximity to the body tube opening in the display panel 213.

According to an embodiment of the disclosure, the conductive material 370 may be a conductive liquid that reacts with the electric charges. For example, the conductive liquid may be at least one of an electrophoretic display material (EPD), an electrically tunable photonic crystal material (ETX™), a magnetically tunable photonic crystal material (MTX™), or a super paramagnetic nanoparticles (SPM™). The conductive liquid may be located at an outer side of the transparent substrate 330 when the electric field or the magnetic field is not applied to the conductive liquid and may move to a center of the transparent substrate 330 when the electric field or the magnetic field is applied to the conductive liquid. Accordingly, the conductive material 370 may cover the body tube opening (e.g., 410 of FIG. 2A) in response to the electric field or the magnetic field.

According to an embodiment of the disclosure, the non-conductive material 380 may be a transparent non-conductive material that is not mixed with the conductive material 370. The non-conductive material 380 may be inserted into the moving space. The non-conductive material 380 may be filled in an area in which the conductive material 370 does not exist in the inner area of the moving space. As an example, the non-conductive material 380 may be a non-conductive liquid like a colorless oil or air.

According to an embodiment of the disclosure, the non-conductive liquid may include a material that does not damage the electrode device 340 of the transparent substrate 330. The non-conductive liquid may include a material that, when leaking out of the moving space, transforms into a solid after being combined with the air. In the embodiment of the disclosure, although the non-conductive liquid flows out due to the damage of the cover window 310, other components may not be damaged.

According to an embodiment of the disclosure, the conductive material 370 and the non-conductive material 380 may be inserted into the moving space in various ways. The method of inserting the conductive material 370 and the non-conductive material 380 may be derived from known techniques, so that detailed descriptions thereof will be omitted.

According to an embodiment of the disclosure, the buffer member 320 (refer to FIGS. 4A, 4C, and 4D) may divide at least a portion of the moving space into a plurality of layers. For example, the buffer member 320 may arrange the conductive material in the plural layers when the electric field or the magnetic field is not applied. Accordingly, the buffer member 320 may prevent the conductive material 370 from being close to the outer side of the transparent substrate 330, and thus may allow the conductive material 370 not to cover the opening of the body tube 420.

According to an embodiment of the disclosure, the buffer member 320 may be formed on an inner surface of the spacer 360. In an embodiment, the buffer member 320 may be formed of the same material as the spacer 360 or the cover window 310 when the cover window 310 or the spacer 360 is manufactured. In an embodiment, the buffer member 320 may be coated with a non-hydrophilic material.

According to an embodiment, the buffer member 320 may have a donut shape when viewed in a top or bottom plan view as shown in FIG. 4C. The buffer member 320 may include a passage through which the conductive material 370 moves, for example, a plurality of holes 325 with a predetermined shape. The holes 325 may provide the passage through which the conductive material 370 disposed in the plural layers by the buffer member 320 moves to a lower layer (e.g., a layer relatively close to the opening of the body tube). The holes 325 may have various shapes. For instance, the holes 325 may have a circular shape to facilitate a fluid movement of the conductive material 370.

FIGS. 5A and 5B are views illustrating an operation of a hidden camera module according to an embodiment of the disclosure.

Referring to FIG. 5A, according to an embodiment of the disclosure, the conductive material 370 may be disposed close to the electrode device 340 when the electric field or the magnetic field is not generated (or, when the power is not applied to the electrode device 340). Accordingly, since the electrode device 340 is disposed at the outer side of the transparent substrate 330 as shown in FIG. 5A, the conductive material may be disposed at the outer side of the transparent substrate 330 when the electric field or the magnetic field is not generated. In this case, the conductive material 370 may be disposed in the plural layers by the buffer member 320 that divides at least the portion of the moving space into the plural layers. Therefore, the opening 410 may be opened when the electric field or the magnetic field is not applied.

As shown in FIG. 5B, when the power is applied to the electrode device 340 to generate the electric field or the magnetic field, the conductive material 370 may react with the electric field or the magnetic field and may becomes relatively closer to the electrode device 340. The conductive material 370 divided into the plural layers of the buffer member 320 may move to a first layer of the buffer member 320 relatively close to the electrode device 340 after passing through the holes 325. Then, the conductive material 370 disposed in the first layer of the buffer member 320 is extruded by the conductive material 370, which has passed through the holes 325, to move toward the center of the transparent substrate 330. The conductive material 370 may move toward the center of the transparent substrate 330 while covering the area where the electrode device 340 does not exist on the transparent substrate 330 to cover at least the portion of the opening 410.

In an embodiment, a degree of the movement of the conductive material 370 to the center of the transparent substrate 330 (the degree of covering of the body tube opening) may be adjusted by controlling the intensity of the electric field or the magnetic field by the electrode device 340. Thus, the hidden camera module 30 may act as the aperture in the shooting mode.

In FIGS. 5A and 5B, the non-conductive material 380 may move in a direction opposite to a direction of the movement of the conductive material 370 due to a property of not being mixed with the conductive material 370. Since the non-conductive material 380 moves in the direction opposite to the direction of the movement of the conductive material 370, the area in which the conductive material 370 does not exist in the transparent housing may be filled with the non-conductive material 380.

According to an embodiment of the disclosure, the conductive material 370 may open the opening 410 when the electric field or the magnetic field is applied. According to an embodiment of the disclosure, the conductive material 370 and the non-conductive material 380 may be a solid that moves in response to the electric field or the magnetic field. In this case, a structure of the moving space of the hidden camera module 30 may be changed.

Various embodiments of the disclosure may perform the lens hiding function and the lens aperture function by applying the hidden camera module between the cover glass of the display module and the camera module. The hidden camera module may control the conductive material by using an electro-wetting method or an electromagnetic force to perform the lens hiding function or the lens aperture function. The embodiments of the disclosure may improve the sense of unfamiliarity of the display, which is caused when the lens body tube disposed under the display is projected to be seen.

FIGS. 6A to 6D are cross-sectional views illustrating hidden camera modules according to various embodiments of the disclosure.

As shown in FIGS. 6A to 6D, according to an embodiment of the disclosure, the electrode device 340 of the hidden camera module 30 may be a transparent electrode positioned at the upper end of the transparent substrate 330. For example, the transparent electrode may be an indium-tin oxide (ITO) film. According to an embodiment of the disclosure, the electrode device 340 may have a size equal to or larger than a size of the opening 410.

Figure 6A:
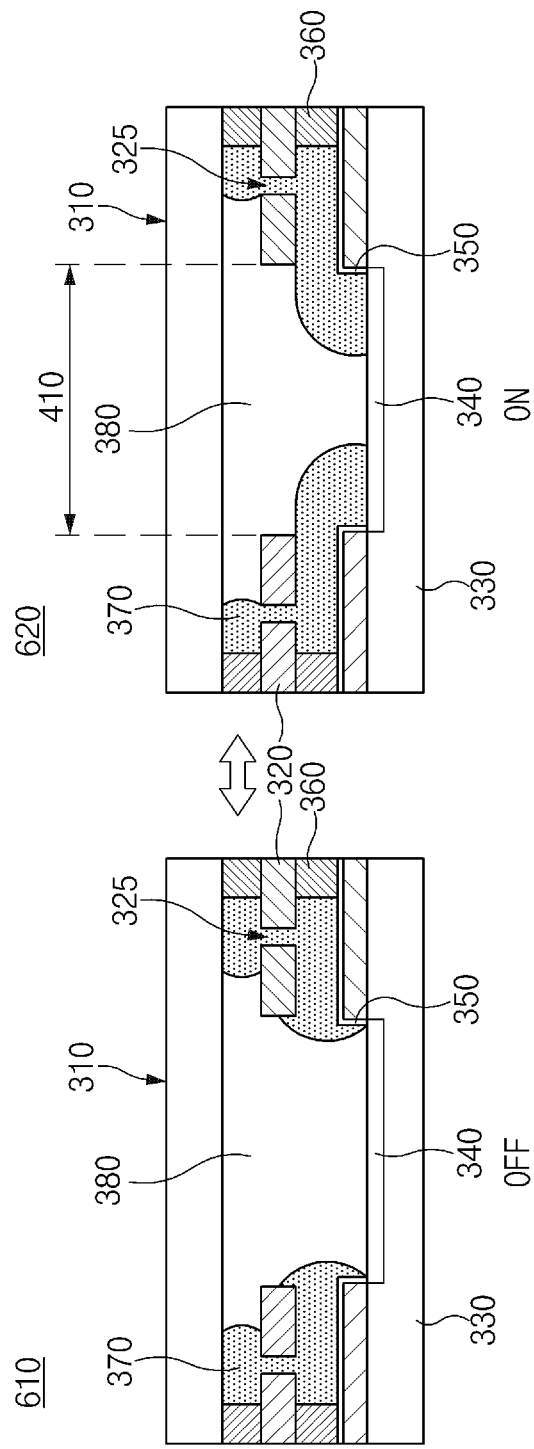
FIGS. 6A to 6D are cross-sectional views illustrating hidden camera modules according to various embodiments of the disclosure.
Figure 6B:
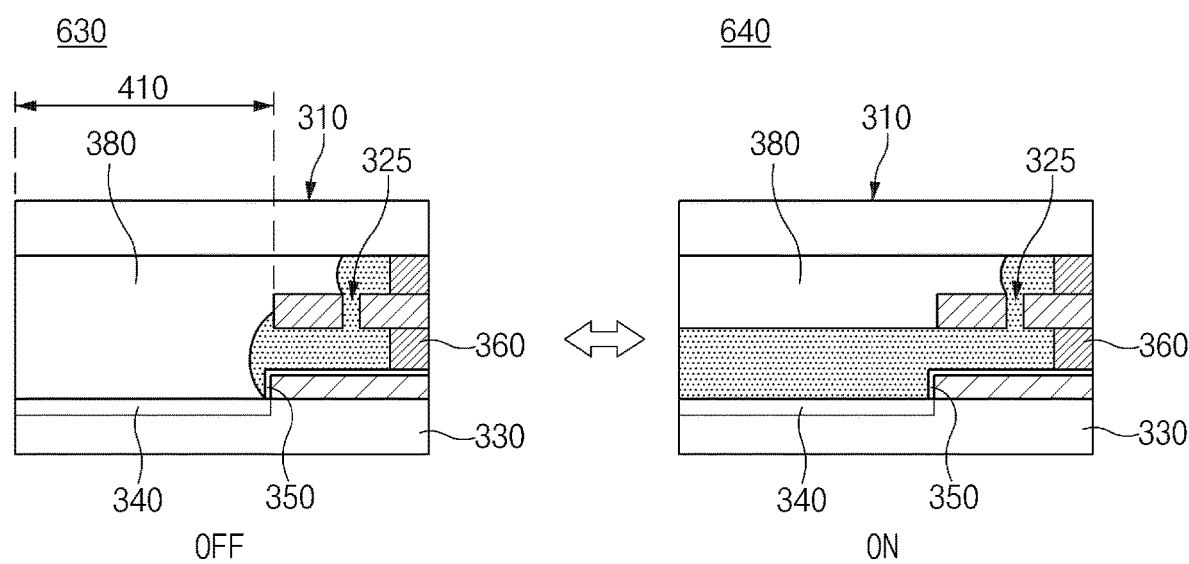

According to an embodiment of the disclosure, at least a portion of the moving space of the hidden camera module 30 may be divided into a plurality of layers by the buffer member 320 as shown in FIGS. 6A and 6B. The moving space of the hidden camera module 30 may be formed in one layer as shown in FIGS. 6C and 6D.

As shown in a cross section of FIG. 6A, according to an embodiment of the disclosure, the hidden camera module 30 may be disposed under the opening 410 and may have a cylindrical shape. The electrode device 340 of the hidden camera module 30 may have a circular shape and may be disposed under the opening 410, for example, at a center of the hidden camera module 30. A center axis of the hidden camera module 30 may be located at a center axis of the opening 410 or located adjacent to the center axis of the opening 410.

According to an embodiment of the disclosure, the conductive material 370 may move to a center direction or an outward direction in the moving space divided into the layers depending on whether the power is applied or not. As an example, as shown in a state 610, the conductive material 370 may be spaced apart from the electrode device 340 when the power is not applied to the electrode device 340 (OFF), and the opening 410 may be opened. As shown in a state 620, the conductive material 370 may move toward the electrode device 340 when the power is applied to the electrode device 340 (ON), and at least a portion of the opening 410 may be covered. In the state 620, when the level of the power applied to the electrode 340 is changed, the degree of covering of the opening 410 may be controlled.

Figure 6C:
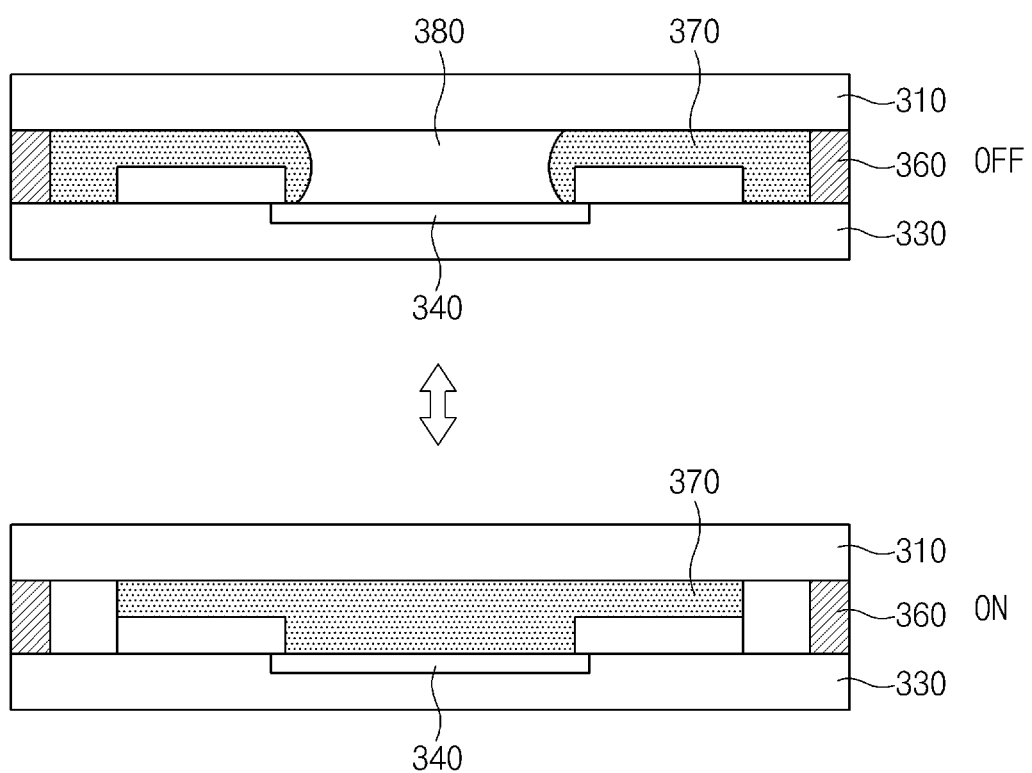
Figure 6D:
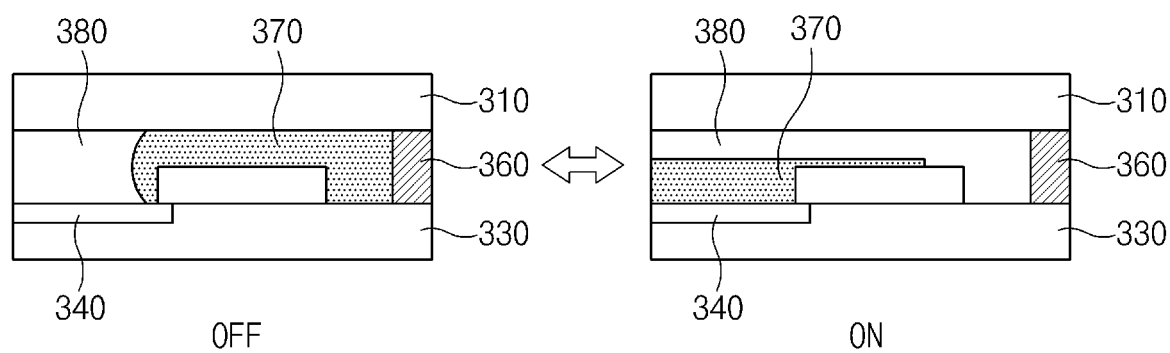

As shown in a cross section of FIG. 6C, the moving space of the hidden camera module 30 may have a cylindrical shape and may be defined above the opening 410. The moving space of the hidden camera module 30 may be formed in one layer. In the moving space of FIG. 6C, the conductive material 370 moves in the same or similar form as described in FIG. 6A, and thus detailed descriptions thereof are omitted.

As shown in a cross section of FIG. 6B, the hidden camera module 30 may have a vertically cut cylindrical shape. For example, the hidden camera module 30 may have the vertically cut cylindrical shape. The hidden camera module 30 may have a semi-cylindrical shape. As another example, the hidden camera module 30 may have a shape closer to the cylindrical shape than to the semi-cylindrical shape. The electrode device 340 of the hidden camera module 30 may have a cut-out circular (or polygonal) shape disposed close to a cut surface of a cut-away cylindrical shape (a left area of 410 in FIG. 6B). According to an embodiment of the disclosure, at least the portion of the moving space of the hidden camera module 30 may be divided into the plural layers by the buffer member 320. The electrode device 340 may be disposed at a lower center of the moving space.

According to an embodiment of the disclosure, the conductive material 370 may move in a direction toward the cut surface or in the outward direction where the electrode device 340 is not disposed (or, a direction opposite to the direction toward the cut surface) depending on whether electric power is applied in the moving space divided into the plural layers. For example, as shown in a state 630, when the power is not applied to the electrode device 340 (OFF), the conductive material 370 is relatively spaced apart from the electrode device 340, and the opening 410 may be opened. As shown in the state 620, when the power is applied to the electrode device 340 (ON), the conductive material 370 moves toward the electrode device 340, and at least the portion of the opening 410 may be covered. In the state 620, when the level of the power applied to the electrode device 340 is changed, the degree of covering the opening 410 may be adjusted. As shown in a cross section of FIG. 6D, the moving space of the hidden camera module 30 may have the vertically cut cylindrical shape and may be disposed at the lower portion of the opening 410, which corresponds to the first layer.

FIGS. 7A to 7D are cross-sectional views illustrating hidden camera modules according to various embodiments of the disclosure. As shown in FIGS. 7A to 7D, the electrode device 340 of the hidden camera module 30 may be a transparent electrode located at the outer side of the moving space. The size of the electrode device 340 may be equal to or smaller than a width between the cover window 310 and the transparent substrate 330.

Figure 7A:
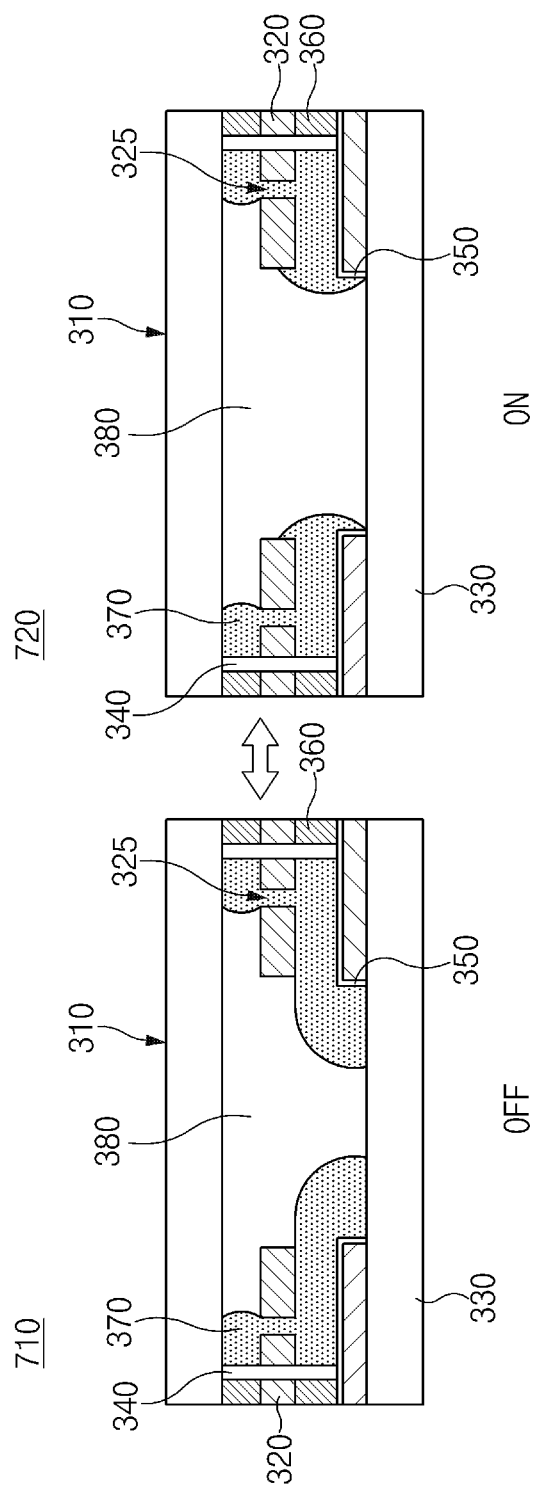
FIGS. 7A to 7D are cross-sectional views illustrating hidden camera modules according to various embodiments of the disclosure.
Figure 7B:
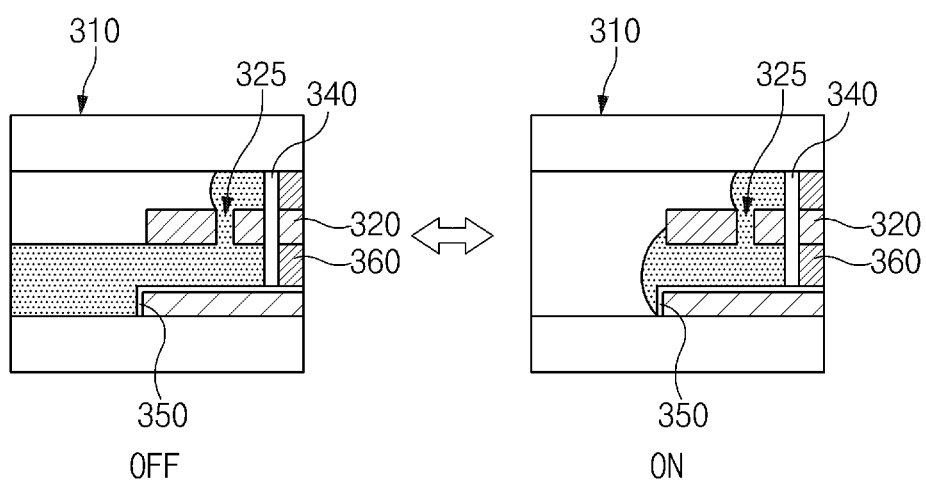
Figure 7C:
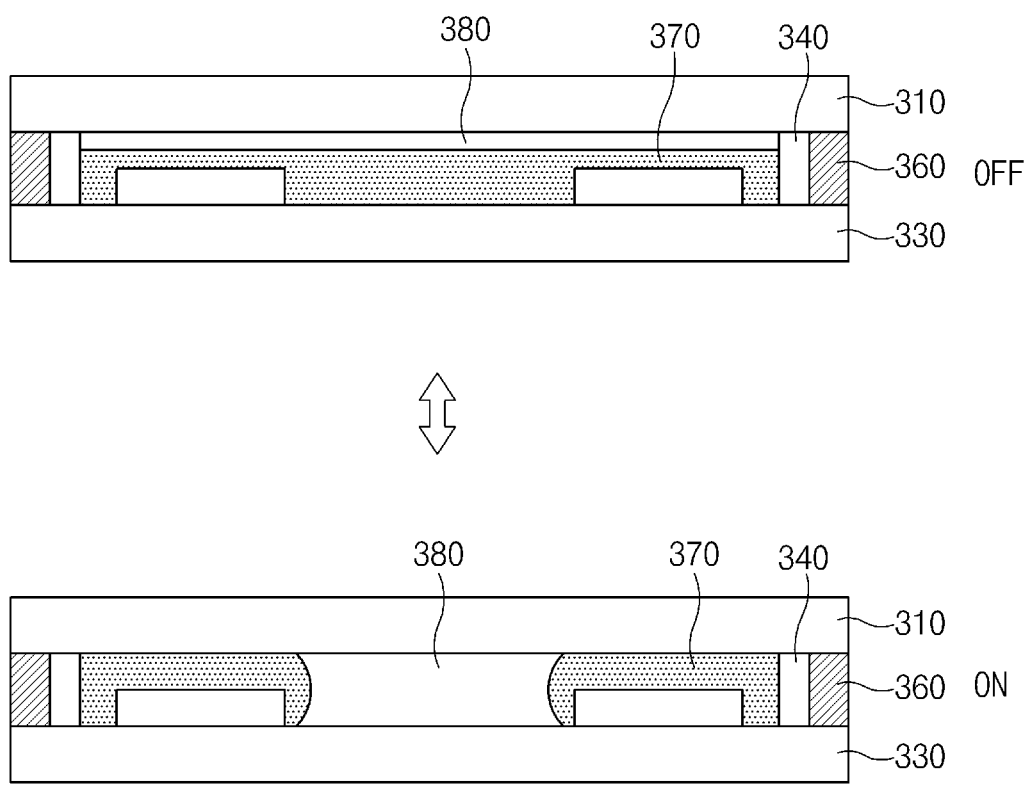
Figure 7D:
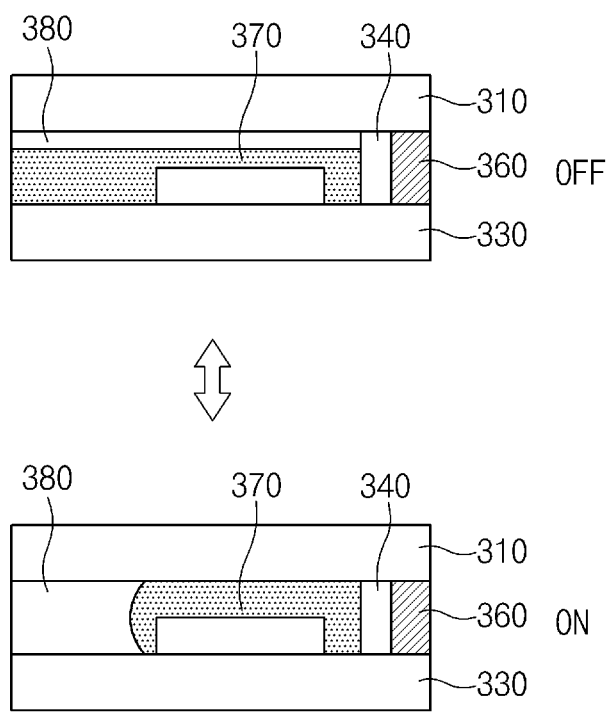

According to an embodiment of the disclosure, at least a portion of the moving space of the hidden camera module 30 may be divided into a plurality of layers by the buffer member 320 as shown in FIGS. 7A and 7B. The moving space of the hidden camera module 30 may be formed in one layer as shown in FIGS. 7C and 7D.

According to an embodiment of the disclosure, when the power is not applied to the electrode device 340, the conductive material 370 may move in a direction away from the electrode device 340, and the opening 410 may be hidden. When the power is applied to the electrode device 340, the conductive material 370 may move to a position close to the electrode device 340, and thus the opening 410 may be opened. In FIGS. 7A to 7D, since the movement of the conductive material 370 is similar to that in FIGS. 6A to 6D, detailed descriptions thereof will be omitted. In FIGS. 7A to 7D, the non-conductive material 380 may move in a direction opposite to a direction of the movement of the conductive material 370 due to a property of not being mixed with the conductive material 370. Since the non-conductive material 380 moves in the direction opposite to the direction of the movement of the conductive material 370, the area in which the conductive material 370 does not exist may be filled with the non-conductive material 380.

Figure 8A:
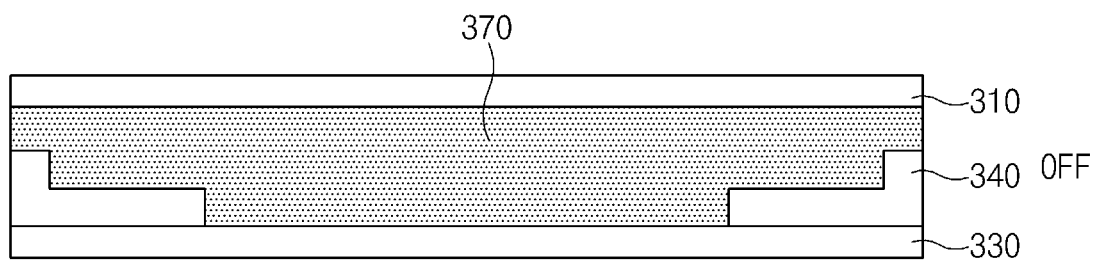
FIGS. 8A to 8D are cross-sectional views illustrating a hidden camera module according to another embodiment of the disclosure.
Figure 8B:
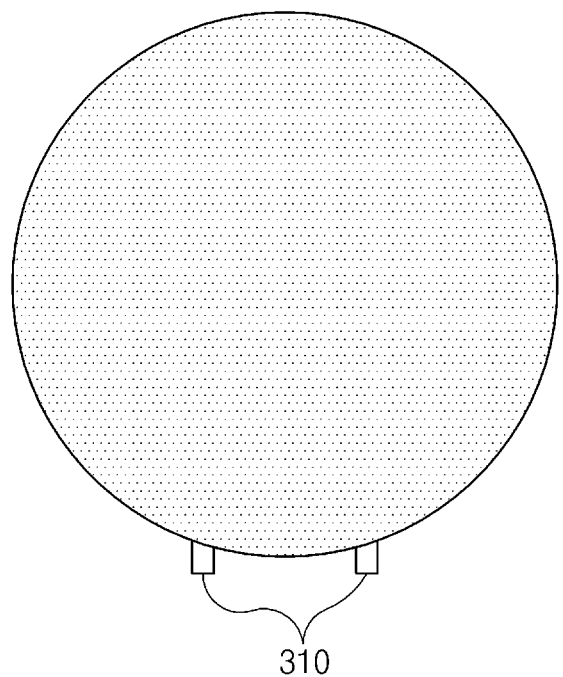
Figure 8C:
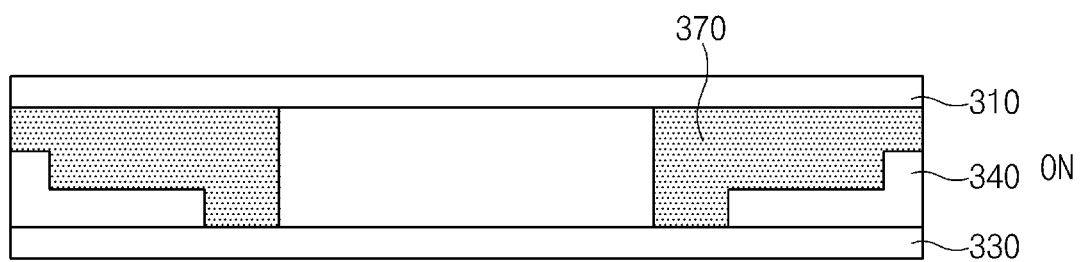
Figure 8D:
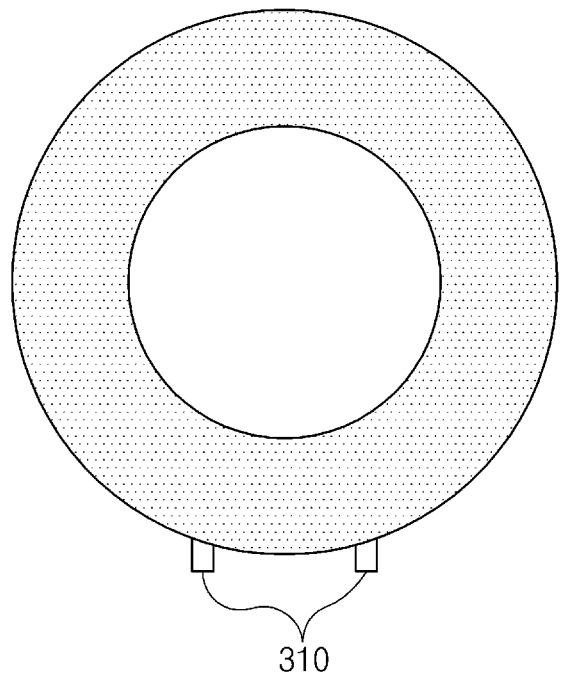

FIGS. 8A to 8D are cross-sectional views illustrating hidden camera modules according to various embodiments of the disclosure. FIGS. 8A and 8C are cross-sectional views illustrating a hidden camera module according to another embodiment of the disclosure. FIGS. 8B and 8D are views illustrating a hidden camera module when viewed in the top view according to another embodiment of the disclosure. In FIGS. 8A to 8D, a hidden camera module 30 to which a nano-ink is applied as a conductive material 370.

As shown in FIGS. 8A to 8D, a moving space of the hidden camera module 30 according to another embodiment of the disclosure may be filled with the conductive material 370. According to an embodiment, the conductive material 370 may be the nano-ink, such as an electrophoretic display material (EPD), an electrically tunable photonic crystal material (ETX™), or a magnetically tunable photonic crystal material (MTX™). According to an embodiment, a non-conductive material 380 may be air. In FIGS. 8A to 8D, a electrode device 340 may be an ITO film or a metal pattern. In FIGS. 8A to 8D, the electrode device 340 may be formed by applying a conductive paint stencil or a stamp to a metal mask. According to an embodiment of the disclosure, the electrode device 340 may be formed along a lower circumference of the hidden camera module 30, for example, in a cylindrical shape. According to an embodiment of the disclosure, the electrode device 340 may be connected to a power supply 80 through a power FPCB 215 extending outside a transparent substrate 330 of the hidden camera module 30.

As shown in FIGS. 8A and 8B, when the power is not applied to the electrode device 340, the conductive material 370 is scattered in the moving space of the hidden camera module 30, and thus the opening 410 may be hidden.

As shown in FIGS. 8C and 8D, when the power is applied to the electrode device 340, the conductive material 370 moves toward the outer side of the hidden camera module 30 as it moves closer to the electrode device 340. Then, the opening 410 may be opened since the opening 410 is not covered by the conductive material 370.

Referring to FIG. 9, there is illustrated an electronic device 901 in a network environment 900 according to various embodiments. The electronic device 901 may include a bus 910, a processor 920, a memory 930, an input/output interface 950, a display 960, and a communication interface 970. According to an embodiment, the electronic device 901 may not include at least one of the above-described elements or may further include other element(s). The bus 910 may interconnect the above-described elements 910 to 970 and may be a circuit for conveying communications (e.g., a control message and/or data) among the above-described elements. The processor 920 may include one or more of a central processing unit (CPU), an application processor, or a communication processor (CP). For example, the processor 920 may perform an arithmetic operation or data processing associated with control and/or communication of at least other elements of the electronic device 901.

The memory 930 may include a volatile and/or nonvolatile memory. For example, the memory 930 may store instructions or data associated with at least one other component(s) of the electronic device 901. According to an embodiment, the memory 930 may store software and/or a program 940. The program 940 may include, for example, a kernel 941, a middleware 943, an application programming interface (API) 945, and/or an application program (or "an application") 947. At least a part of the kernel 941, the middleware 943, or the API 945 may be called an "operating system (OS)". For example, the kernel 941 may control or manage system resources (e.g., the bus 910, the processor 920, the memory 930, and the like) that are used to execute operations or functions of other programs (e.g., the middleware 943, the API 945, and the application program 947). Furthermore, the kernel 941 may provide an interface that allows the middleware 943, the API 945, or the application program 947 to access discrete elements of the electronic device 901 so as to control or manage system resources.

The middleware 943 may perform a mediation role such that the API 945 or the application program 947 communicates with the kernel 941 to exchange data. Furthermore, the middleware 943 may process task requests received from the application program 947 depending on a priority. For example, the middleware 943 may assign the priority, which makes it possible to use a system resource (e.g., the bus 910, the processor 920, the memory 930, or the like) of the electronic device 901, to at least one of the application program 947 and may process the task requests. The API 945 may be, for example, an interface through which the application program 947 controls a function provided by the kernel 941 or the middleware 943, and may include, for example, at least one interface or function (e.g., an instruction) for a file control, a window control, image processing, a character control, or the like. The input/output interface 950 may transfer, for example, an instruction or data input from a user or another external device, to other element(s) of the electronic device 901 or may output an instruction or data, received from other element(s) of the electronic device 901, to the user or the another external device.

The display 960 may include, for example, a liquid crystal display (LCD), a light-emitting diode (LED) display, an organic LED (OLED) display, a microelectromechanical systems (MEMS) display, or an electronic paper display. The display 960 may display, for example, various kinds of content (e.g., a text, an image, a video, an icon, a symbol, and/or the like) to a user. The display 960 may include a touch screen and may receive, for example, a touch, gesture, proximity, or hovering input using an electronic pen or a part of a user's body. The communication interface 970 may establish communication between the electronic device 901 and an external electronic device (e.g., a first external electronic device 902, a second external electronic device 904, or a server 906). For example, the communication interface 970 may be connected to a network 962 through wireless communication or wired communication to communicate with an external device (e.g., the second external electronic device 904 or the server 906).

The wireless communication may include at least one of long term evolution (LTE), LTE Advance (LTE-A), code division multiple access (CDMA), wideband CDMA (WCDMA), universal mobile telecommunications system (UMTS), wireless broadband (WiBro), global system for mobile communications (GSM), or the like, as a cellular communication. According to an embodiment, the wireless communication may include at least one of wireless fidelity (Wi-Fi), Bluetooth, Bluetooth low energy (BLE), Zigbee, near field communication (NFC), magnetic secure transmission (MST), radio frequency (RF), or a body area network (BAN). According to an embodiment, the wireless communication may include Global Navigation Satellite System (GNSS). For example, the GNSS may be one of a global positioning system (GPS), a global navigation satellite system (Glonass), Beidou Navigation Satellite System (hereinafter referred to as "Beidou") or the European global satellite-based navigation system (hereinafter referred to as "Galileo"). In this specification, "GPS" and "GNSS" may be interchangeably used. The wired communication may include at least one of, for example, a universal serial bus (USB), a high definition multimedia interface (HDMI), a recommended standard-232 (RS-232), a power line communication, or a plain old telephone service (POTS). The network 962 may include at least one of telecommunication networks, for example, a computer network (e.g., LAN or WAN), an Internet, or a telephone network.

Each of the external first and second external electronic devices 902 and 904 may be a device of which the type is different from or the same as that of the electronic device 901. According to various embodiments, all or a part of operations that the electronic device 901 will perform may be executed by another or plural electronic devices (e.g., the electronic devices 902 and 904 or the server 906). According to an embodiment, in the case where the electronic device 901 executes any function or service automatically or in response to a request, the electronic device 901 may not perform the function or the service internally, but, alternatively additionally, it may request at least a part of a function associated with the electronic device 901 at other device (e.g., the electronic device 902 or 904 or the server 906). The other electronic device (e.g., the electronic device 902 or 904 or the server 906) may execute the requested function or additional function and may transmit the execution result to the electronic device 901. The electronic device 901 may provide the requested function or service using the received result or may additionally process the received result to provide the requested function or service. To this end, for example, cloud computing, distributed computing, or client-server computing may be used.

Figure 10:
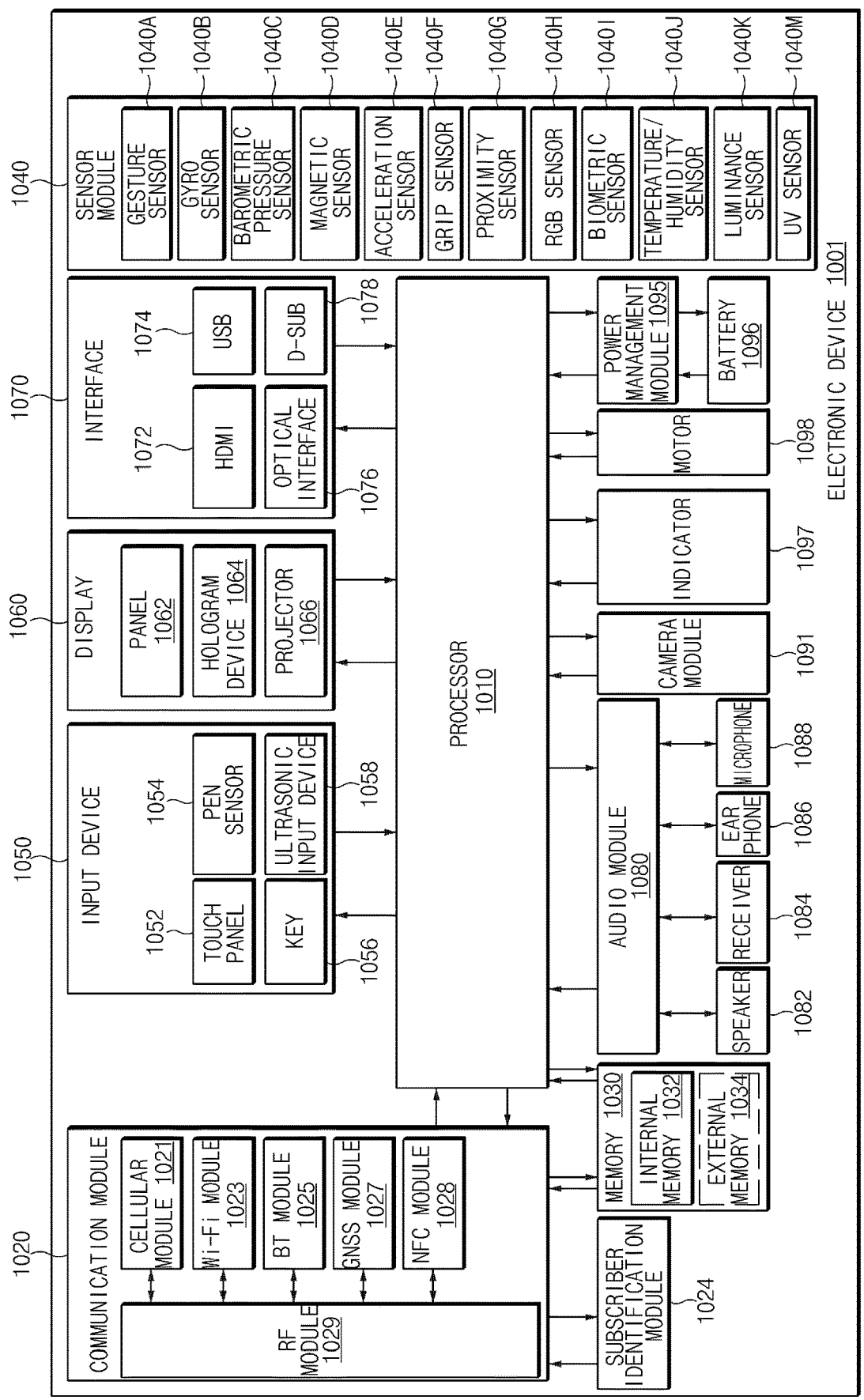
FIG. 10 is a block diagram illustrating an electronic device according to various embodiments.

FIG. 10 illustrates a block diagram of an electronic device 1001 according to various embodiments. The electronic device 1001 may include, for example, all or a part of the electronic device 901 illustrated in FIG. 9. The electronic device 1001 may include one or more processors (e.g., an application processor) 1010, a communication module 1020, a subscriber identification module 1024, a memory 1030, a sensor module 1040, an input device 1050, a display 1060, an interface 1070, an audio module 1080, a camera module 1091, a power management module 1095, a battery 1096, an indicator 1097, and a motor 1098. The processor 1010 may drive, for example, an operating system (OS) or an application to control a plurality of hardware or software elements connected to the processor 1010 and may process and compute a variety of data. For example, the processor 1010 may be implemented with a System on Chip (SoC). According to an embodiment, the processor 1010 may further include a graphic processing unit (GPU) and/or an image signal processor. The processor 1010 may include at least a part (e.g., a cellular module 1021) of elements illustrated in FIG. 10. The processor 1010 may load an instruction or data, which is received from at least one of other elements (e.g., a nonvolatile memory), into a volatile memory and process the loaded instruction or data. The processor 1010 may store a variety of data in the nonvolatile memory.

The communication module 1020 may be configured the same as or similar to the communication interface 970 of FIG. 9. The communication module 1020 may include the cellular module 1021, a Wi-Fi module 1023, a BT module 1025, a GNSS module 1027, a NFC module 1028, and an RF module 1029. The cellular module 1021 may provide, for example, voice communication, video communication, a character service, an Internet service, or the like over a communication network. According to an embodiment, the cellular module 1021 may perform discrimination and authentication of the electronic device 1001 within a communication network using a subscriber identification module 1024 (e.g., a SIM card). According to an embodiment, the cellular module 1021 may perform at least a part of functions that the processor 1010 provides. According to an embodiment, the cellular module 1021 may include a communication processor (CP). According to an embodiment, at least a part (e.g., two or more components) of the cellular module 1021, the Wi-Fi module 1023, the BT module 1025, the GNSS module 1027, or the NFC module 1028 may be included within one Integrated Circuit (IC) or an IC package. The RF module 1029 may transmit and receive, for example, a communication signal (e.g., an RF signal). The RF module 1029 may include a transceiver, a power amplifier module (PAM), a frequency filter, a low noise amplifier (LNA), an antenna, or the like. According to another embodiment, at least one of the cellular module 1021, the Wi-Fi module 1023, the BT module 1025, the GNSS module 1027, or the NFC module 1028 may transmit and receive an RF signal through a separate RF module. The subscriber identification module 1024 may include, for example, a card or embedded SIM that includes a subscriber identification module and may include unique identify information (e.g., integrated circuit card identifier (ICCID)) or subscriber information (e.g., international mobile subscriber identity (IMSI)).

The memory 1030 (e.g., the memory 930) may include an internal memory 1032 or an external memory 1034. For example, the internal memory 1032 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory, or the like), a hard drive, or a solid state drive (SSD). The external memory 1034 may include a flash drive, for example, compact flash (CF), secure digital (SD), micro secure digital (Micro-SD), mini secure digital (Mini-SD), extreme digital (xD), a multimedia card (MMC), a memory stick, or the like. The external memory 1034 may be operatively or physically connected to the electronic device 1001 through various interfaces.

The sensor module (940 may measure, for example, a physical quantity or may detect an operation state of the electronic device 1001. The sensor module 1040 may convert the measured or detected information to an electric signal. The sensor module 1040 may include at least one of a gesture sensor 1040A, a gyro sensor 1040B, a barometric pressure sensor 1040C, a magnetic sensor 1040D, an acceleration sensor 1040E, a grip sensor 1040F, a proximity sensor 1040G, a color sensor 1040H (e.g., red, green, blue (RGB) sensor), a biometric sensor 1040I, a temperature/humidity sensor 1040J, an illuminance sensor 1040K, or an UV sensor 1040M. Additionally or generally, the sensor module 1040 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1040 may further include a control circuit for controlling at least one or more sensors included therein. According to an embodiment, the electronic device 1001 may further include a processor which is a part of the processor 1010 or independent of the processor 1010 and is configured to control the sensor module 1040. The processor may control the sensor module 1040 while the processor 1010 remains at a sleep state.

The input device 1050 may include, for example, a touch panel 1052, a (digital) pen sensor 1054, a key 1056, or an ultrasonic input unit 1058. The touch panel 1052 may use at least one of capacitive, resistive, infrared, or ultrasonic detecting methods. Also, the touch panel 1052 may further include a control circuit. The touch panel 1052 may further include a tactile layer to provide a tactile reaction to a user. The (digital) pen sensor 1054 may be, for example, a part of a touch panel or may include an additional sheet for recognition. The key 1056 may include, for example, a physical button, an optical key, a keypad, or the like. The ultrasonic input device 1058 may sense an ultrasonic signal, which is generated from an input device, through a microphone (e.g., a microphone 1088) and may check data corresponding to the detected ultrasonic signal.

The display 1060 (e.g., the display 960) may include a panel 1062, a hologram device 1064, or a projector 1066, and/or a control circuit to control the panel 1062, the hologram device 1064, or the projector 1066. The panel 1062 may be implemented, for example, to be flexible, transparent or wearable. The panel 1062 and the touch panel 1052 may be integrated into one or more modules. According to an embodiment, the panel 1062 may include a pressure sensor (or a force sensor) which is capable of measuring an intensity of a pressure with respect to a touch of a user. The pressure sensor and the touch panel 1052 may be implemented as an integral or may be implemented with one or more sensors independent of the touch panel 1052. The hologram device 1064 may display a stereoscopic image in a space using a light interference phenomenon. The projector 1066 may project light onto a screen so as to display an image. The screen may be arranged in the inside or the outside of the electronic device 1001. The interface 1070 may include, for example, a high-definition multimedia interface (HDMI) 1072, a universal serial bus (USB) 1074, an optical interface 1076, or a D-subminiature (D-sub) 1078. The interface 1070 may be included, for example, in the communication interface 970 illustrated in FIG. 9. Additionally or generally, the interface 1070 may include, for example, a mobile high definition link (MHL) interface, a SD card/multi-media card (MMC) interface, or an infrared data association (IrDA) standard interface.

The audio module 1080 may convert a sound and an electric signal in dual directions. At least a part of the audio module 1080 may be included, for example, in the input/output interface 950 illustrated in FIG. 9. The audio module 1080 may process, for example, sound information that is input or output through a speaker 1082, a receiver 1084, an earphone 1086, or the microphone 1088. The camera module 1091 for shooting a still image or a video may include, for example, at least one image sensor (e.g., a front sensor or a rear sensor), a lens, an image signal processor (ISP), or a flash (e.g., an LED or a xenon lamp). The power management module 1095 may manage, for example, power of the electronic device 1001. According to an embodiment, the power management module 1095 may include a power management integrated circuit (PMIC), a charger IC, or a battery or fuel gauge. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining capacity of the battery 1096 and a voltage, current or temperature thereof while the battery is charged. The battery 1096 may include, for example, a rechargeable battery and/or a solar battery.

The indicator 1097 may display a specific state of the electronic device 1001 or a part thereof (e.g., a processor 1010), such as a booting state, a message state, a charging state, and the like. The motor 1098 may convert an electrical signal into a mechanical vibration and may generate the following effects: vibration, haptic, and the like. The electronic device 1001 may include a device (e.g., GPU) for supporting the mobile TV that processes media data according to the standards of digital multimedia broadcasting (DMB), digital video broadcasting (DVB), MediaFlo™, or the like. Each of the above-mentioned elements may be configured with one or more components, and the names of the elements may be changed depending on the type of the electronic device. In various embodiments, the electronic device (e.g., the electronic device 1001) may omit some elements or may further include additional elements. Furthermore, some of the elements of the electronic device may be combined with each other so as to form one entity, so that the functions of the elements may be performed in the same manner as before the combination.

Figure 11:
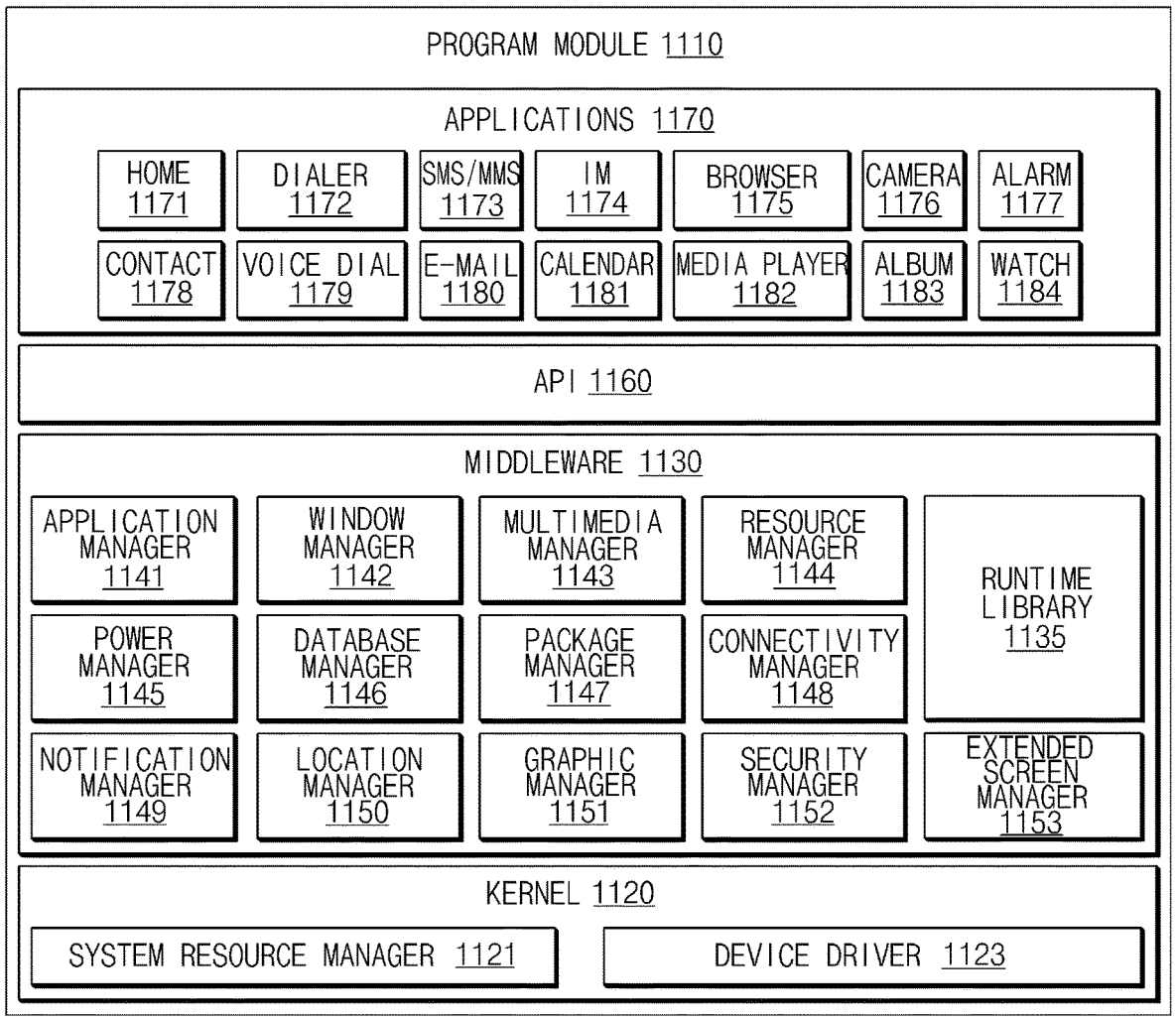
FIG. 11 is a block diagram illustrating a program module according to various embodiments.

FIG. 11 is a block diagram of a program module, according to various embodiments. According to an embodiment, a program module 1110 (e.g., the program 940) may include an operating system to control resources associated with an electronic device (e.g., the electronic device 901), and/or diverse applications (e.g., the application program 947) driven on the OS. The OS may include, for example, Android™, iOS™, Windows™, Symbian™, Tizen™, or Bada™. Referring to FIG. 11, the program module 1110 may include a kernel 1120 (e.g., the kernel 941), a middleware 1130 (e.g., the middleware 943), an application programming interface (API) 1160 (e.g., the API 945), and/or an application 1170 (e.g., the application program 947). At least a part of the program module 1110 may be preloaded on an electronic device or may be downloadable from an external electronic device (e.g., the electronic device 902 or 904, the server 906, or the like).

The kernel 1120 may include, for example, a system resource manager 1121 and/or a device driver 1123. The system resource manager 1121 may perform control, allocation, or retrieval of system resources. According to an embodiment, the system resource manager 1121 may include a process managing part, a memory managing part, or a file system managing part. The device driver 1123 may include, for example, a display driver, a camera driver, a Bluetooth driver, a common memory driver, an USB driver, a keypad driver, a Wi-Fi driver, an audio driver, or an inter-process communication (IPC) driver. The middleware 1130 may provide, for example, a function that the application 1170 needs in common, or may provide diverse functions to the application 1170 through the API 1160 to allow the application 1170 to efficiently use limited system resources of the electronic device. According to an embodiment, the middleware 1130 may include at least one of a runtime library 1135, an application manager 1141, a window manager 1142, a multimedia manager 1143, a resource manager 1144, a power manager 1145, a database manager 1146, a package manager 1147, a connectivity manager 1148, a notification manager 1149, a location manager 1150, a graphic manager 1151, a security manager 1152, or an extended screen manager 1153.

The runtime library 1135 may include, for example, a library module that is used by a compiler to add a new function through a programming language while the application 1170 is being executed. The runtime library 1135 may perform input/output management, memory management, or arithmetic functions. The application manager 1141 may manage, for example, a life cycle of the application 1170. The window manager 1142 may manage a GUI resource that is used in a screen. The multimedia manager 1143 may identify a format necessary for playing media files and may perform encoding or decoding of media files by using a codec suitable for the format. The resource manager 1144 may manage source code of the application 1170 or a storage space. The power manager 1145 may manage a battery capacity or power and may provide power information for an operation of an electronic device. According to an embodiment, the power manager 1145 may operate, for example, with a basic input/output system (BIOS). The database manager 1146 may generate, search for, or modify database which is to be used in the application 1170, for example. The package manager 1147 may install or update an application that is distributed in the form of package file.

The connectivity manager 1148 may manage, for example, wireless connection. The notification manager 1149 may provide an event such as arrival message, appointment, or proximity notification. The location manager 1150 may manage, for example, location information about an electronic device. The graphic manager 1151 may manage, for example, a graphic effect that is provided to a user, or manage a user interface relevant thereto. The security manager 1152 may provide, for example, system security or user authentication. The extended screen manager 1153 may determine, for example, an area of the display at which the graphic is displayed. According to an embodiment, the extended screen manager 1153 may manage information to be provided through the area of the display at which the graphic is displayed, a graphic effect or a user interface relevant thereto. According to an embodiment, the middleware 1130 may include a telephony manager for managing a voice or video call function of the electronic device or a middleware module which is capable of forming a combination of functions of the above-described elements. According to an embodiment, the middleware 1130 may provide a module specialized to each OS kind. The middleware 1130 may dynamically remove a part of the preexisting elements or may add new elements thereto. The API 1160 may be, for example, a set of programming functions and may be provided with another configuration which is variable depending on an OS. For example, in the case where an OS is the Android or the iOS, it may be permissible to provide one API set per platform. In the case where an OS is the Tizen, it may be permissible to provide two or more API sets per platform.

The application 1170 may include, for example, an application such as a home 1171, a dialer 1172, an SMS/MMS 1173, an instant message (IM) 1174, a browser 1175, a camera 1176, an alarm 1177, a contact 1178, a voice dial 1179, an e-mail 1180, a calendar 1181, a media player 1182, an album 1183, a watch 1184, health care (e.g., measuring an exercise quantity, blood sugar, or the like), or offering of environment information (e.g., information of barometric pressure, humidity, temperature, or the like). According to an embodiment, the application 1170 may include an information exchange application to support information exchange between an electronic device and an external electronic device. The information exchanging application may include, for example, a notification relay application for transmitting specific information to the external electronic device, or a device management application for managing the external electronic device. For example, the notification relay application may transmit notification information, which arise from other applications of the electronic device, to the external electronic device or may receive notification information from the external electronic device and provide the notification information to a user. The device management application may install, delete, or update, for example, a function (e.g., turn-on/turn-off of the external electronic device itself (or a part of components) or adjustment of brightness (or resolution) of a display) of the external electronic device which communicates with the electronic device or an application running in the external electronic device. According to an embodiment, the application 1170 may include an application (e.g., a health care application of a mobile medical device) that is assigned in accordance with an attribute of the external electronic device. According to an embodiment, the application 1170 may include an application which is received from the external electronic device. At least a portion of the program module 1110 may be implemented (e.g., executed) by software, firmware, hardware (e.g., the processor 1010), or a combination of two or more thereof and may include modules, programs, routines, sets of instructions, processes, or the like for performing one or more functions.

Figure 12:
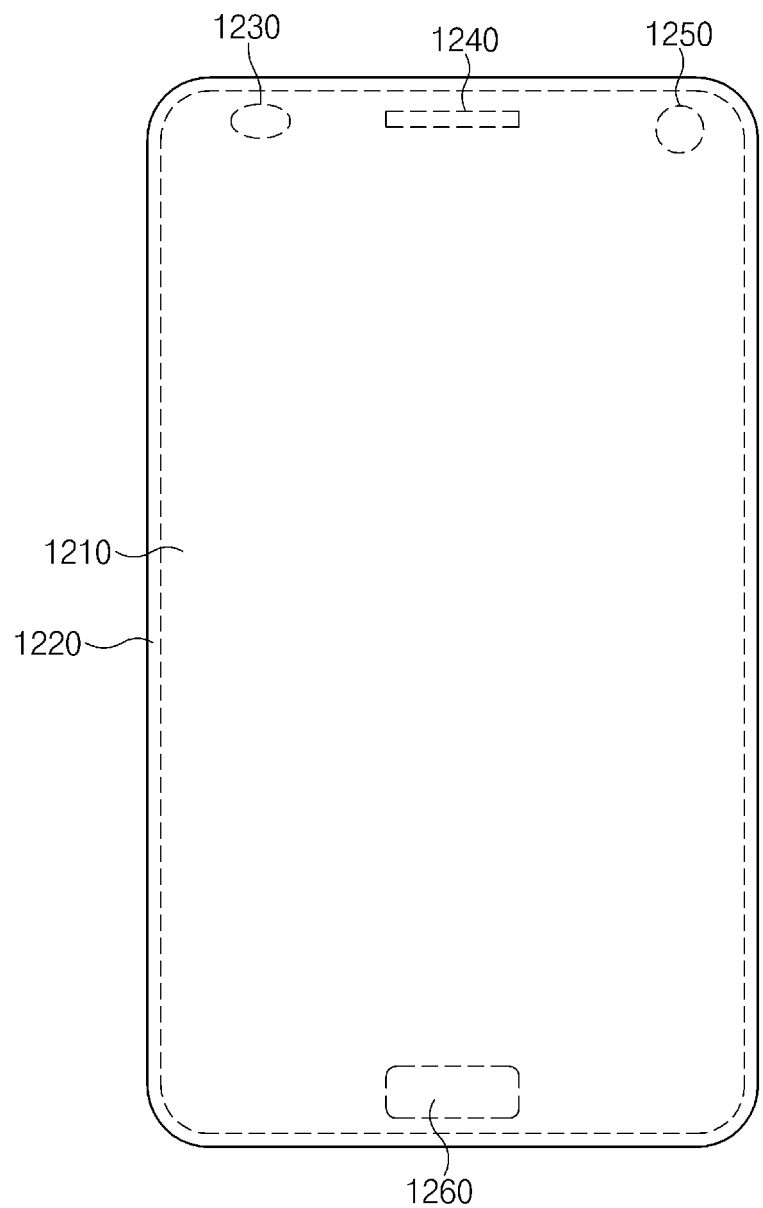
FIG. 12 is a view illustrating a front surface of an electronic device according to various embodiments.

Hereinafter, the front surface of an electronic device 1201 will be described with reference to FIG. 12, according to one embodiment. The electronic device 1201 may include a display 1210, a housing 1220, an optical sensor 1230, a receiver (e.g. speaker) hole 1240, a camera 1250 and a fingerprint sensor 1260. According to an embodiment, the display 1210 may be implemented as substantially the entire front surface of the electronic device 1201. Accordingly, the housing 1220 may constitute a minimal portion of the front surface of the electronic device 1201, or none of the front surface. The display 1210 may extend to, for example, at least one side surface of the electronic device 1201. According to another embodiment, the display 1210 may be positioned on a portion of the front surface of the electronic device 1201. In this case, the housing 1220 may constitute the remaining portion of the front surface of the electronic device 1201.

According to an embodiment, the optical sensor 1230, the receiver hole 1240, and the camera 1250 may be positioned, for example, at the upper end of the housing 1220 and the fingerprint sensor 1260 may be positioned at the lower end of the housing 1220 or the display 1210. In addition, the optical sensor 1230, the receiver hole 1240, the camera 1250, and the fingerprint sensor 1260 may be, for example, covered by the display 1210. The optical sensor 1230 may include, for example, a proximity sensor, an illuminance sensor, an iris sensor, or a UV sensor. According to an embodiment, the positions of the optical sensor 1230, the receiver hole 1240, the camera 1250, and the fingerprint sensor 1260 are not limited to the position illustrated in FIG. 12. For example, the optical sensor 1230 may be positioned at the lower end of the electronic device 1201. As shown in FIG. 12, the hidden camera module 30 may be positioned at an upper end of the body tube of the camera 1250 under the cover glass of the display 1210 located on the front surface of the electronic device 1201.

Figure 13:
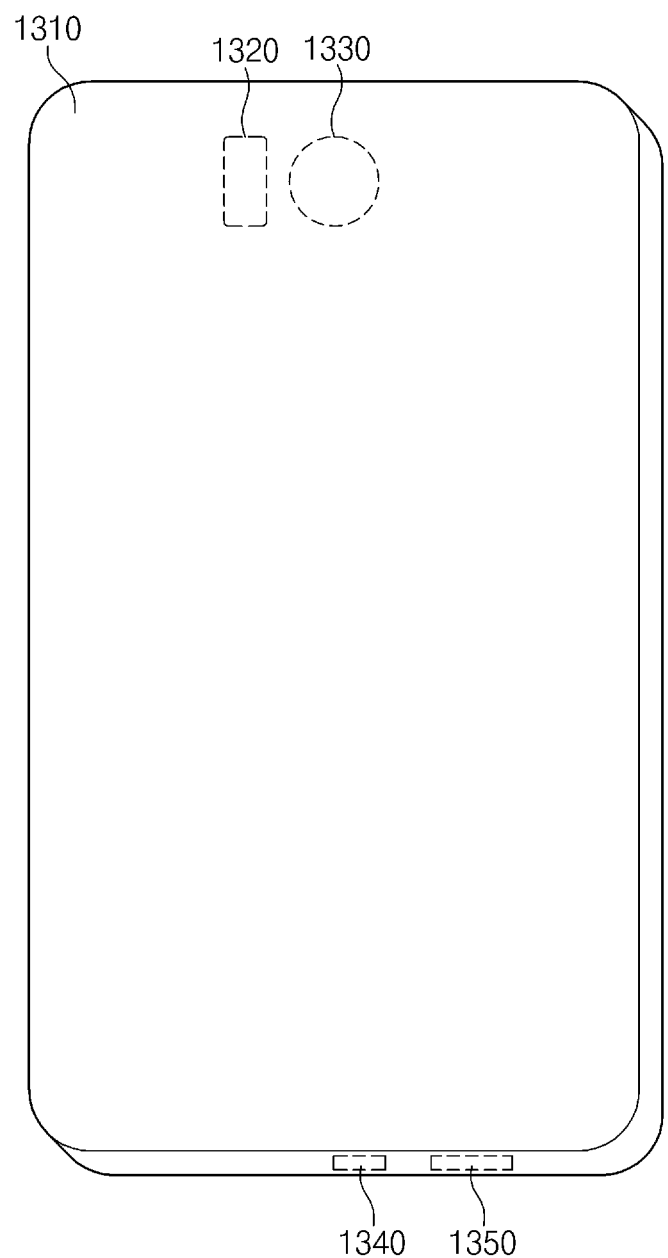
FIG. 13 is a view illustrating a rear surface and a side surface of an electronic device according to various embodiments.

Hereinafter, the rear surface and the side surface of an electronic device 1201 will be described with reference to FIG. 13, according to one embodiment. The electronic device 1201 may include a housing 1210, a biometric sensor 1220, a camera 1330, an interface 1340, and a speaker 1350. According to an embodiment, the housing 1310 may constitute the rear surface and the side surfaces of the electronic device 1301. According to an embodiment, the biometric sensor 1320 and the camera 1330 may be positioned on the rear surface of the electronic device 1301. According to an embodiment, the biometric sensor 1340 and the speaker 1350 may be positioned on the side surface of the electronic device 1301. According to an embodiment, the positions of the biometric sensor 1320, the camera 1330, the interface 1340, and the speaker 1350 are not limited to the position illustrated in FIG. 13. As shown in FIG. 13, the hidden camera module (e.g., the hidden camera module 30 of FIG. 2A) may be positioned inside the rear surface of the electronic device 1301 and may act as a lens cover that covers at least a portion of the body tube opening of the camera 1330.

Figure 14:
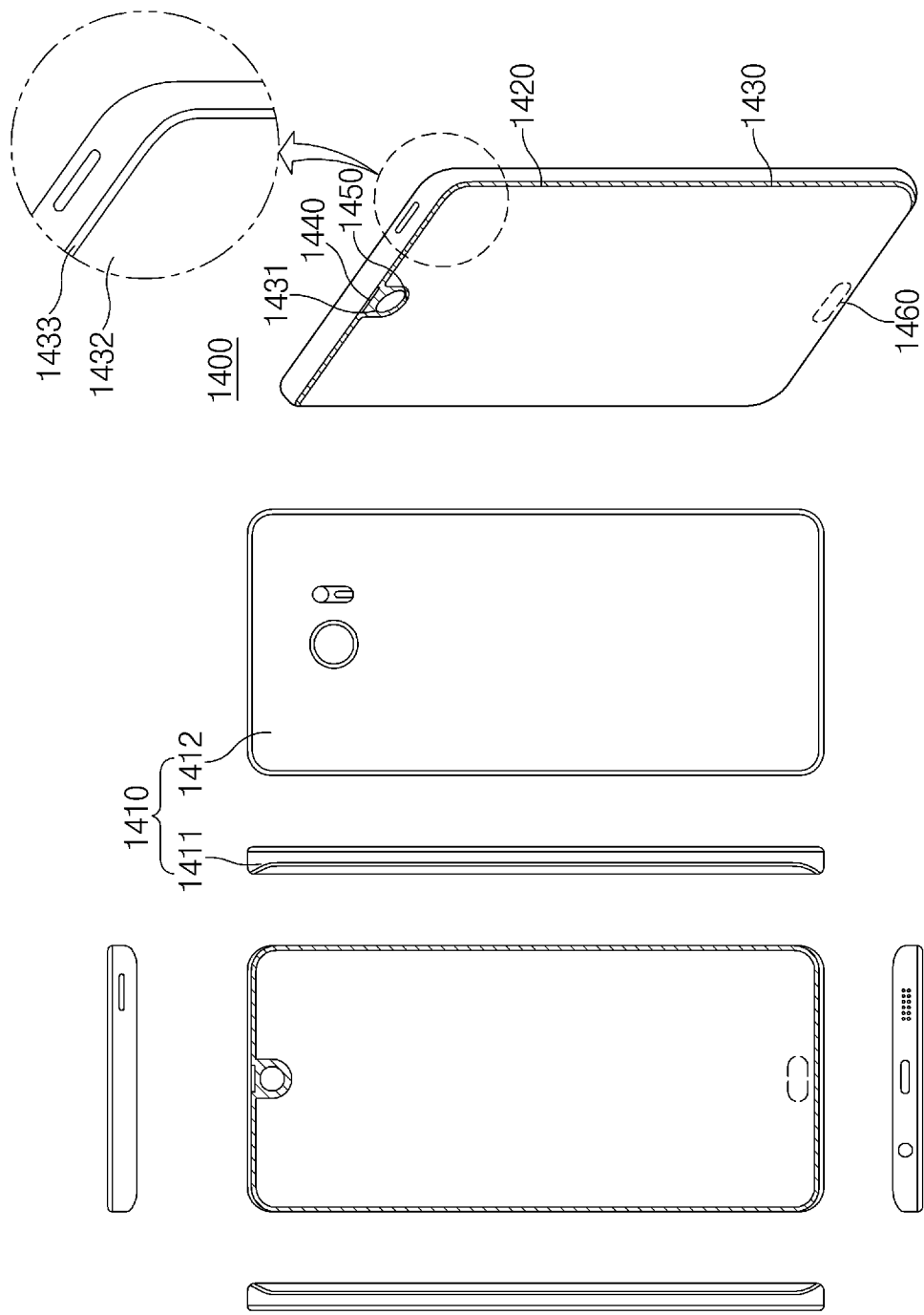
FIG. 14 is a perspective view and six principal views of an electronic device according to an embodiment.

FIG. 14 illustrates a perspective view and six side views of an electronic device, according to an embodiment. Referring to FIG. 14, according to an embodiment, an electronic device 1400 may include a housing 1410, a cover glass 1420, a display panel 1430, a camera module 1440, a receiver or speaker hole 1450, and a home button 1460.

For example, the housing 1410 may include a first surface 1411 facing a first direction (front surface), a second surface 1412 facing a second direction (rear surface) opposite to the first direction, a side surface 1413 surrounding a space between the first surface 1411 and the second surface 1412.

The cover glass 1420 may protect elements such as the display panel 1430 of the electronic device 1400. The cover glass 1420 may correspond to at least the front surface of the electronic device 1400. For example, the cover glass 1420 may occupy the entirety or substantially the entirety of the front surface. In another embodiment, the cover glass 1420 may occupy a portion of the front surface and portions of the side surfaces. The cover glass 1420 may be substantially planar. Or in another embodiment, the cover glass 1420 may be curved such that the upper, lower, left, and/or right end of the cover glass 1420 is bent. The cover glass 1420 may be transparent. The cover glass 1420 may be made of a material such as tempered glass, plastic (e.g., PET), or aluminum oxide.

The display panel 1430 may be disposed under the cover glass 1420. If the cover glass 1420 is curved, the display panel 1430 may also be curved such that the left, right, upper and/or lower end of the display panel 1430 is bent.

The display panel 1430 may be a full front display to occupy substantially the entirety of the front surface of the electronic device. As the display panel 1430 is enlarged, the arrangement of other elements of the display panel 1430 may be changed. For example, elements such as the camera module 1440 and a receiver (not illustrated) may be provided at the outermost portion of the electronic device.

The display panel 1430 may include an active area 1432 and an inactive area 1433.

The active area 1432 may be exposed through the transparent area of the cover glass 1420. The active area 1432 may output light depending on electrical signals supplied through the scan lines and the data lines of the display panel 1430. The aspect ratio of the active area 1432 may be, for example, 19:9.

According to an embodiment, the active area 1432 may occupy at least a portion of the front surface and portion of the side surfaces. According to an embodiment, the active area 1432 may encapsulate the front surface. According to an embodiment, the active area 1432 of the electronic device 1400 may be closer to the side surface as compared with the active area of a typical electronic device. The side portion of the active area 1432 may perform functions such as a soft key for adjusting volume. The position of the soft key may be changed based on a grip state of the user or a user history of the soft key. The active area 1432 may occupy most portions of the front surface. For example, the active area 1432 may occupy about at least 90% of a whole area of the full surface.

The inactive area 1433 may be an area surrounding the active area 1432. According to an embodiment, the inactive area 1433 of the electronic device may be narrower than that of the typical electronic device. At least a portion of the inactive area 1433 may be exposed through the cover glass 1420. For example, the inactive area 1433, which serves as a peripheral area of the display panel 1430, may be covered by an opaque masking layer. The opaque masking layer may be formed by printing a layer on the cover glass 1420. The ration between widthwise and lengthwise thicknesses of the inactive area 1433 may be, for example, 1:1, 2:1, or 3:1. Alternatively, the ratio in thickness among an upper end, a side end, and a lower end of the active area 1433 may be, for example, 2:1:4.

The display panel 1430 may include at least one opening or at least one cutaway part. For example, the display panel 1430 may include at least one opening 1431 formed in the upper end of the active area 1432. The display panel 1430 may be bent such that the opening 1431 is located at a corner of the display panel 1430. As illustrated in FIG. 14, when viewed from the front of the electronic device 1400, the opening 1431 may have a U-shaped space. Various modules of the electronic device 1400 may be exposed through the space formed by the opening 1431.

According to the disclosure, a touch screen display may refer to a module including a touch screen, and/or a polarization plate in addition to a display panel 1430.

The camera module 1440 may be disposed at a position corresponding to the opening 1431. For example, the camera module 1440 may be disposed in a space formed by the opening 1431 or a similar cutaway portion. The camera module 1440 may be disposed in the space formed by the opening 1431 formed in the top end of the active area 1432. The camera module 1440 may be exposed through the cover glass 1420. For example, the camera module 1440 may be visible through the cover glass 1420 when the camera module 1440 is disposed under the cover glass 1420. The camera module 1440 may sense light incident thereto through the cover glass 120, so that it may acquire an image. According to an embodiment, the camera module 1440 may be disposed to be exposed through the center (i.e. middle) of the top end of the cover glass 820. According to an embodiment, the camera module 840 may be disposed towards the left or right side of the front surface.

The receiver hole 1450 may be used to transmit sound, which is generated from a receiver disposed in the housing 1410. The receiver hole 1450 may be formed in the side surface 1413 of the housing 1410. For example, the receiver hole 1450 may be formed in the metallic frame of the side surface 1413. When formed on the side surface, the sound transmitted by the receiver hole 1450 does not exert acoustic forces on the display panel 1430.

The front surface 1411 of the housing may have a specific curvature and may be formed integrally with the side surfaces, when the side surfaces constitute one metallic frame.

The home button 1460 may be disposed at the bottom end of the front surface of the electronic device 1400. The home button 1460 may be a physical key or a soft key. If the home button 1460 is the physical key, the display panel 1430 may include an opening or a cutaway portion formed at the bottom end of the active area 1432. The home button 1460 may be disposed in the space formed by the opening or the cutaway portion.

Alternatively, the home button 1460 may be implemented as a soft key at the lower end of the front surface of the electronic device 1400. If the home button 1460 is a soft key, a fingerprint sensor may be disposed under the area for the home button 1460 in the display panel 1430. The cover glass 1420 may include a recess part formed above the position where the fingerprint sensor is disposed.

As described above, according to an embodiment, the electronic device 1400 may include the display panel 1430, which is exposed through the front surface 1411 of the electronic device 1400, and the camera module 1440 positioned inside the display panel 1430. In FIG. 14, the hidden camera module (e.g., the hidden camera module 30 of FIG. 2A) may act as a lens cover of the camera applied to the front or rear surface of the electronic device 1400.

The term "module" as used in the disclosure may represent, for example, a unit including one or more combinations of hardware, software and firmware. The term "module" may be interchangeably used with the terms "unit", "logic", "logical block", "component" and "circuit". The "module" may be a standalone unit or part of an integrated component for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of the apparatus (e.g., modules or functions thereof) or the method (e.g., operations) according to embodiments of the disclosure may be, for example, implemented by instructions stored in a computer-readable storage media in the form of a program module. The instruction, when executed by the processor 820, may cause the processor to perform a function corresponding to the instruction.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory)). Also, a program instruction may include not only a mechanical code such as generated by a compiler but also a high-level language code executable on a computer using an interpreter.

A module or a program module according to an embodiment of the disclosure may include at least one of the above elements, or a part of the above elements may be omitted, or additional other elements may be further included. Operations performed by a module, a program module, or other elements may be executed sequentially, in parallel, repeatedly, or in a heuristic method. In addition, some operations may be executed in different sequences or may be omitted. Alternatively, other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

We claim:

1. An electronic device comprising:
a cover glass;
a display module, including a display panel, disposed under the cover glass and having an opening therein covered by the cover glass; and
a camera including:
an image sensor;
a body tube including an upper portion extending into the opening in the display module and including a lens group, wherein the body tube includes an opening aligned with the opening formed in the display module and the lens group is disposed between the opening in the body tube and the image sensor; and
an aperture module configured to vary an amount of external light entering the opening of the body tube,
wherein the aperture module is disposed in the opening formed in the display module and comprises:
a transparent substrate including a first portion and a second portion;
a transparent cover window spaced apart from the transparent substrate;
a spacer disposed between the transparent cover window and the transparent substrate;
an opaque conductive material disposed in a space defined by the transparent cover window, the transparent substrate, and the spacer; and
an electrode device formed on the transparent substrate for generating an electric field or a magnetic field when power is supplied to the electrode device,
wherein the first portion of the transparent substrate is spaced apart from the transparent cover window by a first distance, and the second portion of the transparent substrate is spaced apart from the transparent cover window by a second distance greater than the first distance,
wherein the first portion of the transparent substrate is positioned above the opening in the body tube, and the second portion of the transparent substrate is positioned on an inner surface of the opening formed in the display module and is surrounding the upper portion of the body tube, and
wherein the opaque conductive material is configured to, when the electric field or the magnetic field is generated, react with the electric field or the magnetic field in the space and move to cover the opening of the body tube.

2. The electronic device of claim 1, wherein the electrode device is coated with a non-conductive material.

3. The electronic device of claim 1, wherein the electrode device is formed at a position of an entire surface of a lower surface or an upper surface of the transparent substrate to allow the opaque conductive material before moving to open the opening of the body tube and to allow the opaque conductive material after moving to cover the opening of the body tube.

4. The electronic device of claim 1, wherein the opaque conductive material is configured to open the opening of the body tube when no electric field or magnetic field is generated by the electrode device.

5. The electronic device of claim 4, wherein the electrode device is positioned at a center area of the transparent substrate and the opaque conductive material is spaced apart from the electrode device when no electric field or magnetic field is generated by the electrode device.

6. The electronic device of claim 4, wherein the electrode device is positioned at an outer area of the transparent substrate and the opaque conductive material moves closer to the electrode device when no electric field or magnetic field is generated by the electrode device.

7. The electronic device of claim 1, wherein the opaque conductive material has a same or similar color as an area positioned close to the opening of the body tube.

8. The electronic device of claim 1, wherein the opaque conductive material has a color that varies when the opaque conductive material reacts with the electric field or the magnetic field.

9. The electronic device of claim 1, further comprising a transparent non-conductive material in the space, the non-conductive material including a material that is not mixable with the opaque conductive material.

10. The electronic device of claim 1, wherein a lower surface of the transparent cover window is coated with a non-hydrophilic material.

11. The electronic device of claim 1, further comprising a buffer, wherein the buffer includes openings for allowing the opaque conductive material to move from one side of the buffer to the other.

12. The electronic device of claim 11, wherein the opaque conductive material is present on both sides of the buffer when no electric field or magnetic field is generated by the electrode device.

13. The electronic device of claim 11, wherein the opaque conductive material positioned at an upper side of the buffer is configured to:
  move to a lower side of the buffer through the openings in response to the electric field or the magnetic field; and
  move toward the center of the transparent substrate.

14. The electronic device of claim 1, wherein a degree of covering or opening of the opening of the body tube is adjusted depending on an intensity of the electric field or the magnetic field.

15. The electronic device of claim 1, further comprising:
  a processor electrically connected to the display panel and the camera,
  wherein the camera is disposed at a same height as at least a portion of the display panel under the cover glass, includes at least an area positioned in the opening of the body tube, and covers at least a portion of the opening of the body tube through the at least the area, and
  the processor is configured to supply or not supply power to the electrode device when the display panel is in an active state and the camera is not in a shooting mode so as to cover the at least the portion of the opening.

* * * * *